(12) United States Patent
You et al.

(10) Patent No.: US 7,800,177 B2
(45) Date of Patent: Sep. 21, 2010

(54) THIN FILM TRANSISTOR PLATE AND METHOD OF FABRICATING THE SAME

(75) Inventors: Chun-gi You, Hwaseong-si (KR);
Kyung-min Park, Seongnam-si (KR);
Gyung-soon Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 361 days.

(21) Appl. No.: 11/480,223

(22) Filed: Jun. 30, 2006

(65) Prior Publication Data
US 2007/0007524 A1    Jan. 11, 2007

(30) Foreign Application Priority Data
Jun. 30, 2005  (KR) ...................... 10-2005-0058437
Jun. 30, 2005  (KR) ...................... 10-2005-0058444

(51) Int. Cl.
*H01L 27/12*    (2006.01)
(52) U.S. Cl. ............................... 257/347; 257/E27.112
(58) Field of Classification Search ................ 257/213, 257/288, 347, 348, 349, 350, 351, 352, 353, 257/354, E27.112
See application file for complete search history.

(56) References Cited

U.S. PATENT DOCUMENTS

| | | | | |
|---|---|---|---|---|
| 5,200,630 A | * | 4/1993 | Nakamura et al. | 257/570 |
| 5,644,147 A | * | 7/1997 | Yamazaki et al. | 257/66 |
| 5,821,622 A | * | 10/1998 | Tsuji et al. | 257/763 |
| 6,037,263 A | * | 3/2000 | Chang | 438/712 |
| 2003/0025127 A1 | * | 2/2003 | Yanai et al. | 257/158 |
| 2003/0124778 A1 | * | 7/2003 | Doi et al. | 438/151 |
| 2004/0051100 A1 | * | 3/2004 | Yamazaki et al. | 257/59 |

* cited by examiner

*Primary Examiner*—Sue Purvis
*Assistant Examiner*—Kevin Quinto
(74) *Attorney, Agent, or Firm*—Innovation Counsel LLP

(57) ABSTRACT

A thin film transistor (TFT) plate having improved processing efficiency without degradation in performance and a method of fabricating the TFT plate are provided. The TFT plate includes gate insulating layer patterns made of dual layers. Upper portions of both sidewalls of an upper gate insulating layer pattern are substantially aligned with both sidewalls of a gate electrode. Lower portions of both sidewalls of the upper gate insulating layer pattern are substantially aligned with a boundary portion between a lightly doped region and a source region and a boundary portion between the lightly doped region and a drain region. Thus, the concentration of the lightly doped region under a lower gate insulating layer pattern gradually changes.

9 Claims, 21 Drawing Sheets

THIN FILM TRANSISTOR PLATE AND METHOD OF FABRICATING THE SAME

BACKGROUND OF THE INVENTION

This application claims priority from Korean Patent Application Nos. 10-2005-0058437 filed on Jun. 30, 2005 and 10-2005-0058444 filed on Jun. 30, 2005, in the Korean Intellectual Property Office, the disclosures of which are incorporated by reference herein in their entireties.

1. Field of the Invention

The present invention relates to a thin film transistor (TFT) plate and a method of fabricating the same, and more particularly, to a TFT plate having improved processing efficiency without degradation in performance and a method of fabricating the TFT plate.

2. Description of the Related Art

Recently, in liquid crystal displays (LCDs) used as display devices for notebook computers or other portable devices, driving methods thereof are shifting from a simple matrix type to an active matrix type. In particular, a thin-film transistor (TFT) active matrix driving method has become the mainstream technology for driving the LCDs.

A TFT generally includes a gate electrode as a part of a gate line, a semiconductor layer forming a channel, a source electrode as a part of a data line, and a drain electrode facing the source electrode on the semiconductor layer. The TFT is generally used as a switching element for transmitting or blocking a data signal received through the data line by a gate signal transferred through the gate line.

The semiconductor layer is made of amorphous silicon or polycrystalline silicon. A thin-film transistor is categorized into a bottom-gate type and a top-gate type according to its position relative to a gate electrode. A polycrystalline silicon TFT is usually of a top gate type in which a gate electrode is disposed above an active layer.

A driving speed of the polycrystalline silicon TFT is much faster than that of the amorphous silicon TFT. Thus, the polycrystalline silicon TFT is advantageously able to form a driving circuit in cooperation with TFTs of pixel. However, there is a punch-through problem with the polycrystalline silicon TFT. To overcome this problem, it is preferable to form a lightly doped region between a channel region and the source/drain regions of the semiconductor layer.

According to a conventional method for forming a lightly doped region, a gate electrode is comprised of two conductive layers on a semiconductor layer, one of which is used as a mask for defining a lightly doped region and the other of which is used as a mask for defining a source region and a drain region after the formation of the lightly doped region. However, forming two conductive layers in different patterns through one-time photolithography makes the manufacturing process complicated and difficult to define the width of the lightly doped region. As a result, the entire process time increases, causing a decrease in fabrication yield.

SUMMARY OF THE INVENTION

The present invention provides a thin film transistor (TFT) plate without degradation in performance.

The present invention also provides a method of fabricating a TFT plate having improved processing efficiency without degradation in performance.

According to an aspect of the present invention, there is provided a thin film transistor (TFT) plate including a substrate, a semiconductor layer, a gate electrode, a first gate insulating layer, a second gate insulating layer, an interlayer insulating layer, and a source electrode and a drain electrode. The semiconductor layer is formed on the substrate and includes a lightly doped region adjacent to both sides of a channel region, and a source region and a drain region adjacent to the lightly doped region. The gate electrode is formed on the channel region of the semiconductor layer. The first gate insulating layer is formed between the semiconductor layer and the gate electrode. The second gate insulating layer is formed between the first gate insulating layer and the gate electrode and has sidewalls that are substantially aligned with a boundary portion between the lightly doped region and the source region and a boundary portion between the lightly doped region and the drain region. The interlayer insulating layer is formed on the resultant structure. The source electrode and the drain electrode are formed on the interlayer insulating layer and are electrically connected to the source region and the drain region through a first contact hole and a second contact hole of the interlayer insulating layer.

According to another aspect of the present invention, there is provided a thin film transistor (TFT) plate including a substrate a semiconductor layer formed on the substrate and including a lightly doped region adjacent to both sides of a channel region, and a source region and a drain region adjacent to the lightly doped region, a gate electrode formed on the channel region of the semiconductor layer, a first gate insulating layer formed between the semiconductor layer and the gate electrode, a second gate insulating layer formed between the first gate insulating layer and the gate electrode and having sidewalls whose upper portions are substantially aligned with both sidewalls of the gate electrode and whose lower portions are substantially aligned with a boundary portion between the lightly doped region and the source region and a boundary portion between the lightly doped region and the drain region, an interlayer insulating layer formed on the resultant structure, and a source electrode and a drain electrode formed on the interlayer insulating layer and electrically connected to the source region and the drain region through a first contact hole and a second contact hole of the interlayer insulating layer.

According to still another aspect of the present invention, there is provided a thin film transistor (TFT) plate including a substrate a semiconductor layer formed on the substrate and including a lightly doped region adjacent to both sides of a channel region, and a source region and a drain region adjacent to the lightly doped region, a gate electrode formed on the channel region of the semiconductor layer, a first gate insulating layer formed between the semiconductor layer and the gate electrode and having sidewalls that are substantially aligned with a boundary portion between the lightly doped region and the source region and a boundary portion between the lightly doped region and the drain region, a capping layer formed on the resultant structure, an interlayer insulating layer formed on the capping layer, and a source electrode and a drain electrode formed on the interlayer insulating layer and electrically connected to the source region and the drain region through a first contact hole and a second contact hole of the interlayer insulating layer.

According to a further aspect of the present invention, there is provided a method of fabricating a thin film transistor (TFT) plate, the method including providing a substrate where a semiconductor layer, a first gate insulting layer, a second gate insulating layer, and a metal layer are sequentially formed, forming a gate electrode by patterning the metal layer using a photoresist pattern formed on the metal layer as an etching mask, patterning the second gate insulating layer using the photo resist layer pattern as an etching mask, implanting impurity ions using the gate electrode and the patterned second gate insulating layer as ion implantation masks, thereby forming a channel region in a region of the semiconductor layer corresponding to a position of the gate electrode, a lightly doped region in regions of the semiconductor layer corresponding to positions of portions of the patterned second gate insulating layer exposed by the gate electrode, and a source region and a drain region in regions of the semiconductor layer corresponding to positions of sides of the second gate insulating layer, forming an interlayer insulating layer on the resultant structure, and forming a source electrode and a drain electrode electrically connected to the source region and the drain region through a first contact hole and a second contact hole of the interlayer insulating layer on the interlayer insulating layer.

According to yet a further aspect of the present invention, there is provided a method of fabricating a thin film transistor (TFT) plate, the method including forming a semiconductor layer on a substrate, sequentially forming a first gate insulating layer, a second insulating layer, and a metal layer on the semiconductor layer, forming a gate electrode by patterning the metal layer using a photoresist layer pattern formed on the metal layer as an etching mask, patterning the second gate insulating layer using the photoresist pattern as an etching mask such that the thicknesses of both sidewalls of the patterned second gate insulating layer decrease towards both sidewalls of the patterned second gate insulating layer from portions of the patterned second gate insulating layer exposed by the gate electrode, implanting impurity ions using the gate electrode and the patterned second gate insulating layer as ion implantation masks, thereby forming a channel region in a region of the semiconductor layer corresponding to a position of the gate electrode, a lightly doped region in regions of the semiconductor layer corresponding to positions of portions of the patterned second gate insulating layer exposed by the gate electrode, and a source region and a drain region in regions of the semiconductor layer corresponding to positions of sides of the second gate insulating layer, forming an interlayer insulating layer on the resultant structure, and forming a source electrode and a drain electrode electrically connected to the source region and the drain region through a first contact hole and a second contact hole of the interlayer insulating layer on the interlayer insulating layer.

According to still yet another aspect of the present invention, there is provided a method of fabricating a thin film transistor (TFT) plate, the method including providing a substrate where a semiconductor layer, a first gate insulting layer, a second gate insulating layer, and a metal layer are sequentially formed, forming a gate electrode by patterning the metal layer using a photoresist pattern formed on the metal layer as an etching mask, patterning the second gate insulating layer using the photo resist layer pattern as an etching mask, implanting low-concentration impurity ions using the gate electrode and the patterned second gate insulating layer as ion implantation masks, thereby forming a channel region in a region of the semiconductor layer corresponding to a position of the gate electrode and a lightly doped region in regions of the semiconductor layer corresponding to positions of portions of the patterned second gate insulating layer exposed by the gate electrode, implanting high-concentration impurity ions using the gate electrode and the patterned second gate insulating layer as ion implantation masks, thereby forming a source region and a drain region in regions of the semiconductor layer corresponding to positions of sides of the second gate insulating layer, forming an interlayer insulating layer on the resultant structure, and forming a source electrode and a drain electrode electrically connected to the source region and the drain region through a first contact hole and a second contact hole of the interlayer insulating layer on the interlayer insulating layer.

According to still yet a further aspect of the present invention, there is provided a method of fabricating a thin film transistor (TFT) plate, the method including forming a semiconductor layer on a substrate sequentially forming a first gate insulating layer, a second insulating layer, and a metal layer on the semiconductor layer, forming a gate electrode by patterning the metal layer using a photoresist layer pattern formed on the metal layer as an etching mask, patterning the second gate insulating layer using the photoresist pattern as an etching mask, implanting low-concentration impurity ions using the gate electrode and the patterned second gate insulating layer as ion implantation masks, thereby forming a channel region in a region of the semiconductor layer corresponding to a position of the gate electrode and a lightly doped region in regions of the semiconductor layer corresponding to positions of portions of the patterned second gate insulating layer exposed by the gate electrode, forming a capping layer on the resultant structure, implanting high-concentration impurity ions using the capping layer, the gate electrode, and the patterned second gate insulating layer as ion implantation masks, thereby forming a source region and a drain region in regions of the semiconductor layer corresponding to positions of sides of the second gate insulating layer, forming an interlayer insulating layer on the capping layer, and forming a source electrode and a drain electrode electrically connected to the source region and the drain region through a first contact hole and a second contact hole of the capping layer and the interlayer insulating layer on the interlayer insulating layer.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The above and other features and advantages of the present invention will become more apparent by describing in detail exemplary embodiments thereof with reference to the attached drawings in which.

Figure 1:
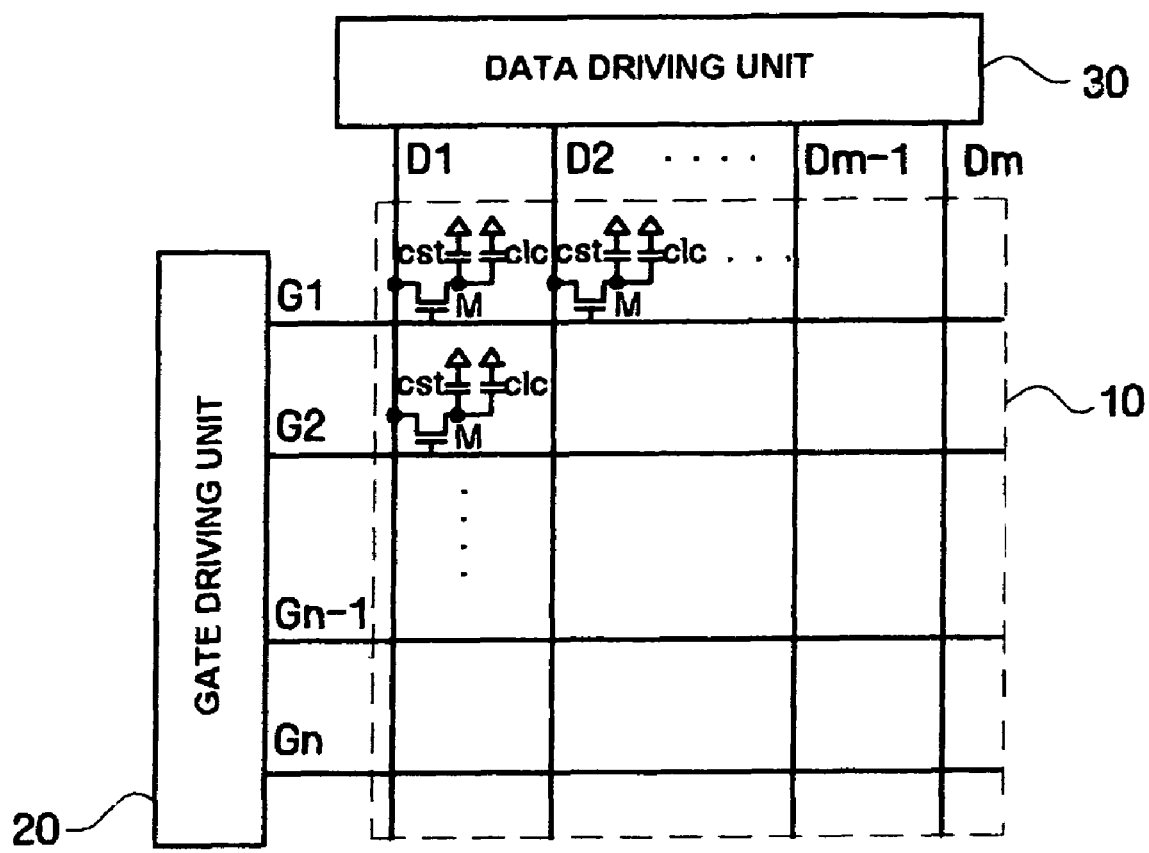
FIG. 1 schematically illustrates a TFT plate according to an embodiment of the present invention.

Embodiments of the present invention and their advantages are best understood by referring to the detailed description that follows. It should be appreciated that like reference numerals are used to identify like elements illustrated in one or more of the figures. It should also be appreciated that the figures may not be necessarily drawn to scale.

DETAILED DESCRIPTION OF THE INVENTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

In the drawings, the thickness of layers, films, and regions may be exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a thin film transistor (TFT) plate according to an embodiment of the present invention will be described with reference to FIGS. 1 through 3. A thin film transistor (TFT) plate according to an embodiment of the present invention will be described with reference to FIG. 1. As shown in FIG. 1 in accordance with an embodiment of the present invention, the TFT plate includes a pixel unit 10, a gate driving unit 20, and a data driving unit 30.

The pixel unit 10 includes a plurality of pixels connected to a plurality of gate lines G1 through Gn and a plurality of data lines D1 through Dm. Each pixel includes a switching element M connected to the plurality of gate lines G1 through Gn and the plurality of data lines D1 through Dm and a liquid crystal capacitor Clc and a storage capacitor Cst connected to the switching element M.

The plurality of gate lines G1 through Gn formed in a row direction transfer gate signals corresponding to gray-scale voltages to the switching element M. The switching element M is a three-terminal element having a control gate connected to the gate lines G1 through Gn, an input terminal connected to the lines D1 through Dm, and an output terminal connected to the liquid crystal capacitor Clc and one terminal of the storage capacitor Cst. The liquid crystal capacitor Clc may be connected between the output terminal of the switching element M and the common electrode (not shown). The storage capacitor Cst may be connected between the output terminal of the switching element M and the common electrode (Separate Wire Type) or may be connected between the output terminal of the switching element M and the previous gate lines G1 through Gn (Previous Gate Type).

The gate driving unit 20 is connected to the plurality of gate lines G1 through Gn and provides a gate signal for activating the switching element M to the plurality of gate lines G1 through Gn. The data driving unit 30 is connected to the plurality of data lines D1 through Dm.

Here, the switching element M is a MOS transistor implemented as a TFT having polycrystalline silicon in a channel region. The gate driving unit 20 and the data driving unit 30 may also be MOS transistors implemented as TFTs having polycrystalline silicon in channel regions. A TFT plate having polycrystalline silicon as a channel region will be described with reference to FIGS. 2 and 3.

Figure 2:
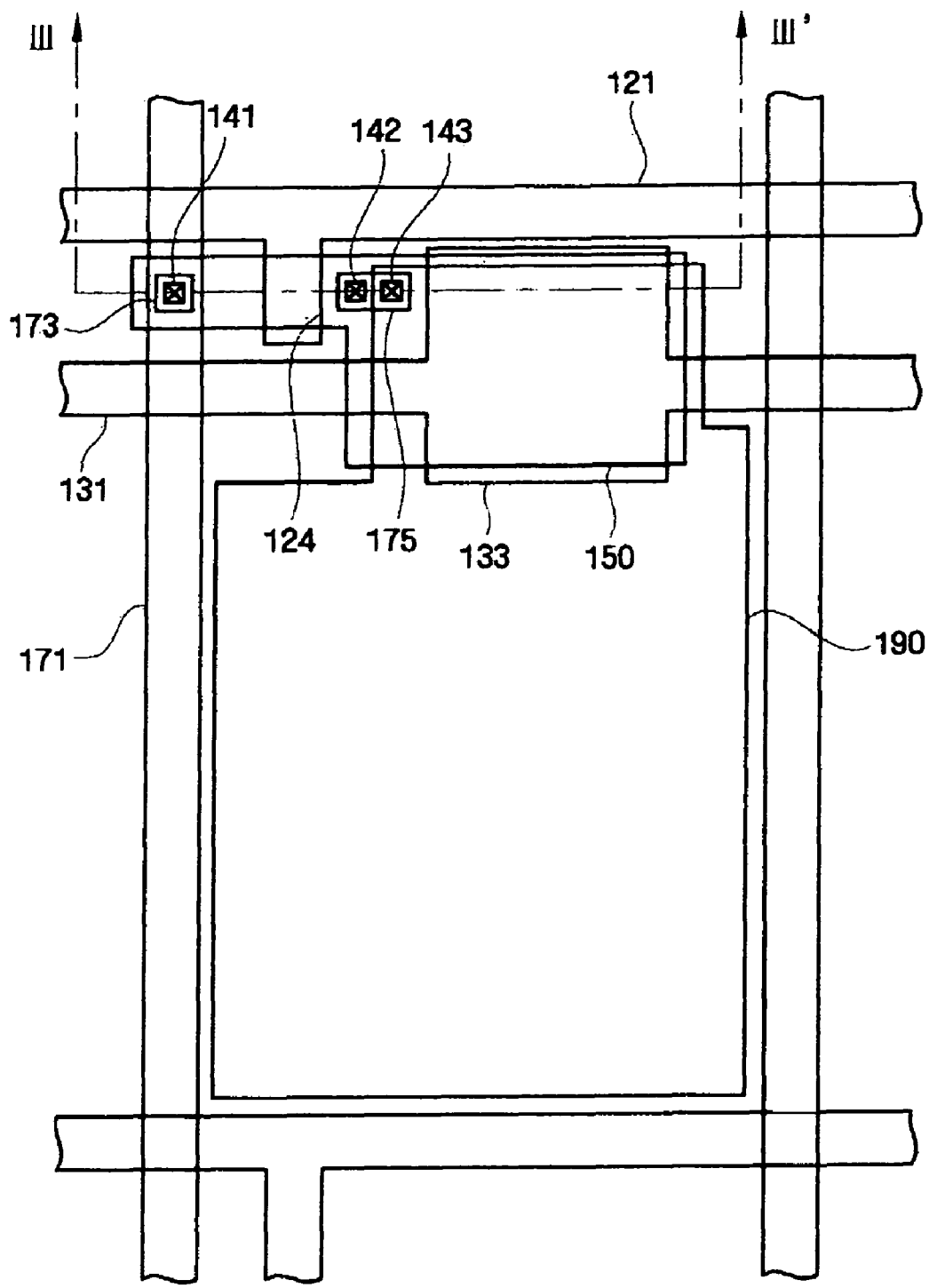
FIG. 2 is a layout of a pixel unit of a TFT plate according to an embodiment of the present invention.
Figure 3:
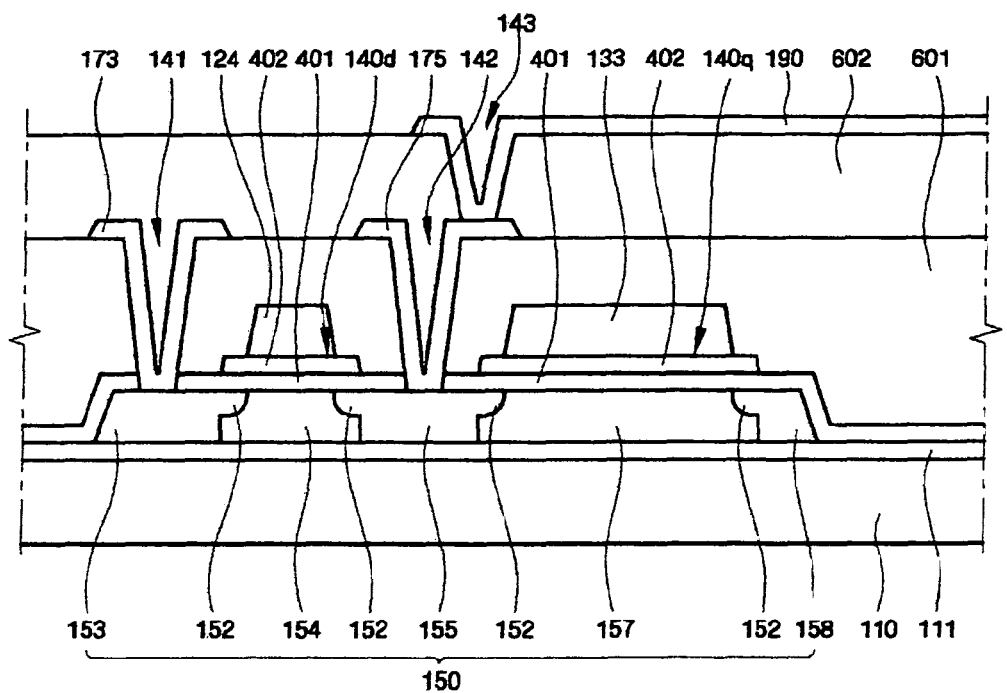
FIG. 3 is a sectional view of the TFT plate of FIG. 2 taken along a line III-III'.

FIG. 2 is a layout of a pixel unit of a TFT plate according to an embodiment of the present invention, and FIG. 3 is a sectional view of the TFT plate of FIG. 2 taken along a line III-III'.

As shown in FIGS. 2 and 3, a blocking layer 111 made of silicon oxide or silicon nitride is formed on a transparent insulating substrate 110. A semiconductor layer 150 made of polycrystalline silicon is formed on the blocking layer 111 for a TFT including a source region 153 and a drain region 155 doped with high concentration n-type impurity and a channel region 154 that is not doped with impurity between the source region 153 and the drain region 155. A lightly doped region 152 doped with low concentration n-type impurity is formed between the source region 153 and the channel region 154 and between the drain region 155 and the channel region 154. Here, the blocking layer 111 is formed for the purpose of blocking impurities of substrate 110 from diffusing into the semiconductor layer 150. However, it is noted that the blocking layer 111 is not required and may not be formed in some embodiments.

Gate insulating layer patterns 140d and 140q are formed on the substrate 110 including the semiconductor layer 150 made of polycrystalline silicon. The gate insulating layer patterns 140d and 140q include a first gate insulating layer pattern 401 made of silicon oxide and a second gate insulating layer pattern 402 made of silicon nitride. In order to reduce a threshold voltage (Vth) of a TFT including the semiconductor layer 150 made of polycrystalline silicon, it is necessary to reduce a thickness of a gate insulating layer pattern. However, in a case of forming the gate insulating layer pattern using a conventional silicon oxide layer having a small dielectric constant, e.g., 3.9, there is a limit to reducing the threshold voltage Vth of the TFT. To overcome this limitation, if the thickness of the gate insulating layer pattern is reduced, a breakdown voltage is also reduced, which may increase the probability of failures due to static electricity. Therefore, the TFT according to an embodiment of the present invention can reduce the threshold voltage Vth and improve performance thereof using a double-layered structure as the gate insulating layer pattern, that is, in one example the first gate insulating layer pattern 401 is made of silicon oxide and the second gate insulating layer pattern 402 is made of silicon nitride having a dielectric constant about twice that of silicon oxide.

The first gate insulating layer pattern 401 is formed in the form of a first insulating layer on the entire surface of the substrate 110 where the semiconductor layer 150 made of polycrystalline silicon is formed. Here, first and second contact holes as paths for electrically connecting the source region 153 and the drain region 155 in the semiconductor layer 150 with source and data electrodes to be described later, respectively, are formed in the first insulating layer. In addition, both sidewalls of the second gate insulating layer pattern 402 are substantially aligned with a boundary portion between the lightly doped region 152 and the source and drain regions 153 and 155.

The second gate insulating layer pattern 402 serves to insulate the semiconductor layer 150 made of polycrystalline silicon from the gate electrode 124 and the storage electrode 133. In addition, when impurity ions are injected for forming the source and drain regions, which will later be described, the second gate insulating layer pattern 402 serves as an ion implantation mask as well. Since the semiconductor layer 150 is divided into the lightly doped region 152 and the source/drain regions 153 and 155 aligned with the sidewalls of the second gate insulating layer pattern 402, it is necessary that both the sidewalls of the second gate insulating layer pattern 402 are substantially aligned with the boundary portion between the lightly doped region 152 and the source region 153 and the boundary portion between the lightly doped region 152 and the drain region 155 in the manufacturing process.

A gate line 121 (FIG. 2) extending in one direction is formed on the gate insulating layer pattern 140d and a portion of the gate line 121 extends to overlap with the channel region 154 of the semiconductor layer 150 made of polycrystalline silicon. The overlapping portion of the gate line 121 is used as a gate electrode 124 of the TFT plate.

A storage electrode line 131 (FIG. 2) for increasing the storage capacity of a pixel is formed on the gate insulating layer pattern 140q in parallel with the gate line 121 and is formed of the same material and on the same layer as the gate line 121. A portion of the storage electrode line 131 overlapping with the semiconductor layer 150 made of polycrystalline silicon corresponds to the storage electrode 133 and the semiconductor layer 150 overlapping with the storage electrode 133 corresponds to a storage electrode region 157.

The lightly doped region 152 is formed at both sides of the storage electrode region 157 and the heavily doped region 158 is formed at one side of the storage electrode region 157. The other portion of the gate line 121 may have a wider width to be connected with an external circuit and may be directly connected with the output terminal of a gate driving circuit.

A first interlayer insulating layer 601 is formed on the gate insulating layer patterns 140d and 140q and the semiconductor layer 150 where the gate line 121, the storage electrode line 131, and the gate electrode 124 are formed. The first interlayer insulating layer 601 includes a first contact hole 141 and a second contact hole 142 exposing the source region 153 and the drain region 155, respectively.

A data line 171 (FIG. 2) intersecting the gate line 121 and defining a pixel region is formed on the first interlayer insulating layer 601. A portion or branch portion of the data line 171 is connected to the source region 153 through the first contact hole 141 and a portion of the data line 171 connected to the source region 153 is used as a source electrode 173 of the TFT plate. One end of the data line 171 may have a wider width to be connected with an external circuit and may be directly connected with the output terminal of a data driving circuit.

A drain electrode 175 spaced apart from the source electrode 173 and connected to the drain region 155 through the second contact hole 142 is formed on the same layer as the data line 171.

A second interlayer insulating layer 602 is formed on the first interlayer insulating layer 601, the source electrode 173, the drain electrode 175, and the data line 171. The second interlayer insulating layer 602 includes a third contact hole 143 exposing the drain electrode 175. A pixel electrode 190 connected to the drain electrode 175 through the third contact hole 143 is formed in each pixel region on the second interlayer insulating layer 602.

Figure 4:
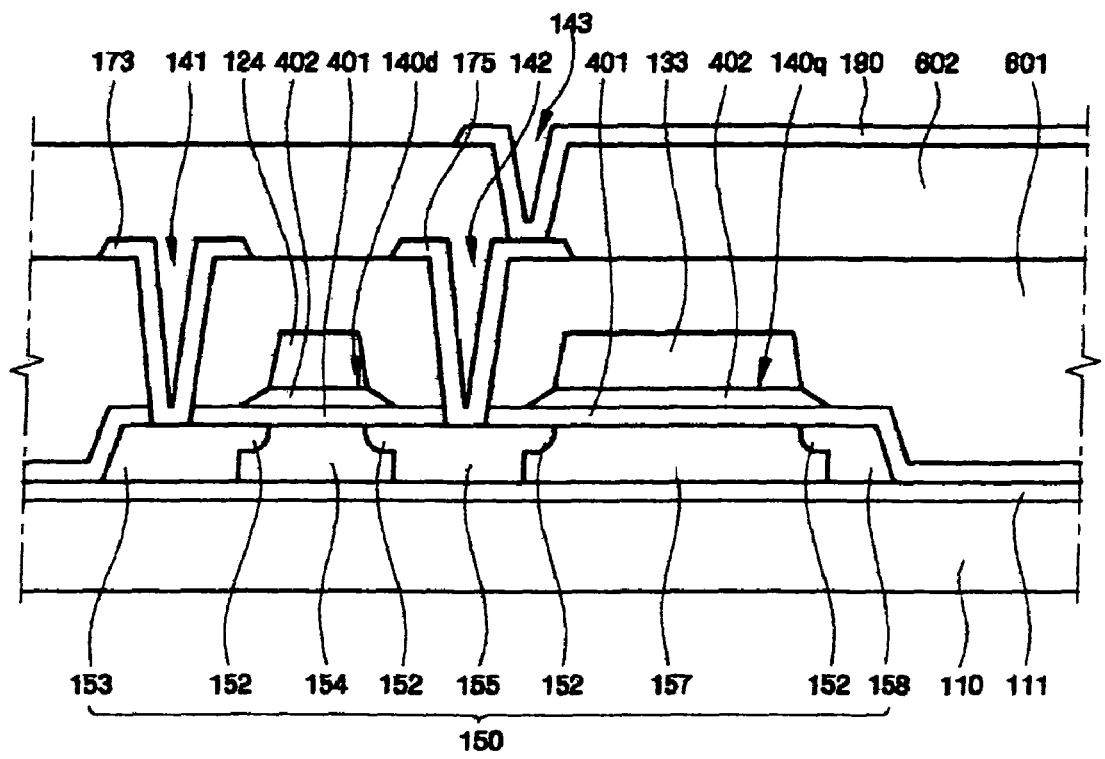
FIGS. 4 through 7 are sectional views of a TFT plate including a TFT according to embodiments of the present invention.

Next, a TFT plate according to another embodiment of the present invention will be described with reference to FIG. 4. FIG. 4 is a sectional view of a TFT plate including a TFT according to embodiments of the present invention. The TFT plate according to this embodiment of the present invention is substantially the same as the TFT plate described above with respect to FIGS. 1-3 except that both sidewalls of the second gate insulating layer pattern 402 are tapered such that the upper portions of the sidewalls are substantially aligned with respective sidewalls of the gate electrode 124 and lower portions of the sidewalls of the second gate insulating layer pattern 402 are substantially aligned with a boundary portion between the lightly doped region 152 and the source region 153, a boundary portion between the lightly doped region 152 and the drain region 155, and a boundary portion between the lightly doped region 152 and the heavily doped region 158. Repetitive explanation of the same elements will not be given.

Since the upper portions of both sidewalls of the second gate insulating layer pattern 402 are substantially aligned with both sidewalls of the gate electrode 124 and the lower portions of both sidewalls of the second gate insulating layer pattern 402 are substantially aligned with the boundary portion between the lightly doped region 152 and the source region 153, the boundary portion between the lightly doped region 152 and the drain region 155, and the boundary portion between the lightly doped region 152 and the heavily doped region 158, surfaces connecting the upper portions and lower portions of both sidewalls of the second gate insulating layer pattern 402 are inclined. The concentration of impurity ions of the lightly doped region 152 of the semiconductor layer 150 under an inclined portion including the inclined surfaces gradually increases towards the boundary portion between the lightly doped region 152 and the source region 153, the boundary portion between the lightly doped region 152 and the drain region 155, and the boundary portion between the lightly doped region 152 and the heavily doped region 158, which will later be described in more detail in describing a method of fabricating a TFT plate.

Figure 5:
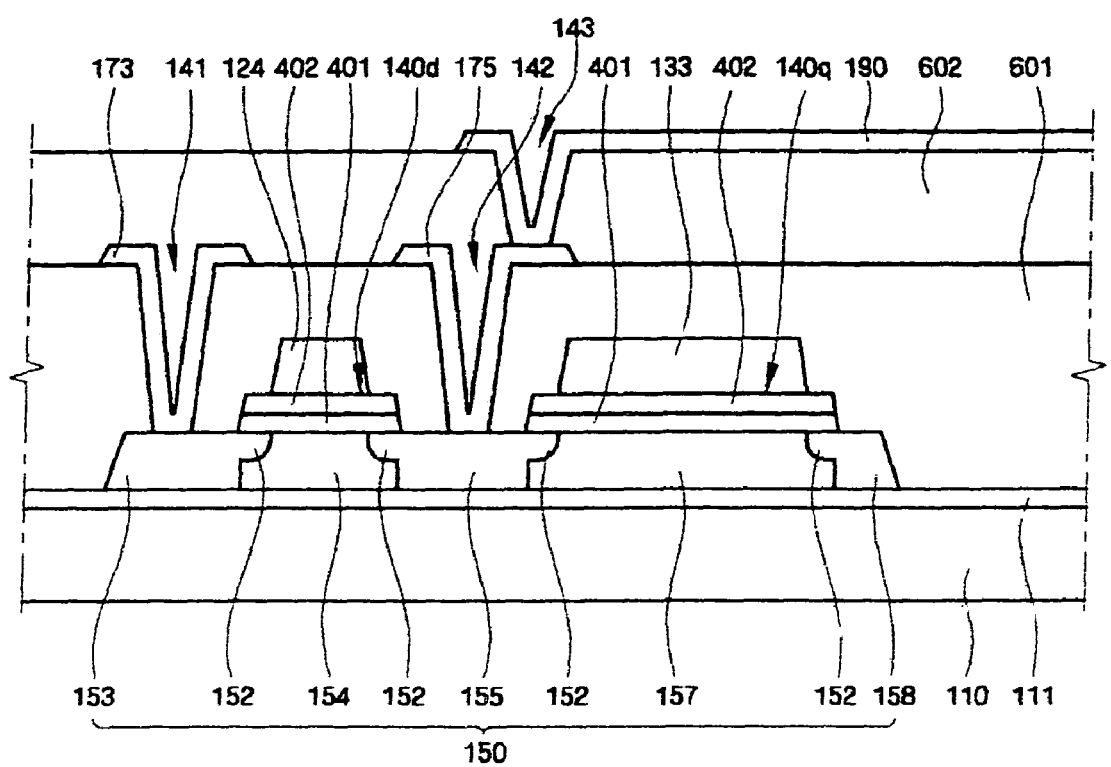

Next, a TFT plate according to still another aspect of the present invention will be described with reference to FIG. 5. FIG. 5 is a sectional view of a TFT plate including a TFT according to embodiments of the present invention. The TFT plate according to this embodiment of the present invention is substantially the same as the TFT plate described above with respect to FIGS. 1-3 except that both sidewalls of the second gate insulating layer pattern 402 are substantially aligned with the boundary portion between the lightly doped region 152 and the source region 153, the boundary portion between the lightly doped region 152 and the drain region 155, and the boundary portion between the lightly doped region 152 and the heavily doped region 158, and both sidewalls of the first gate insulating layer pattern 401 are substantially aligned with both sidewalls of the second gate insulating layer pattern 402, such that the sidewalls of the first and second gate insulating layer patterns 401 and 402 form substantially linear surfaces. Repetitive explanation of the same elements will not be given.

Figure 6:
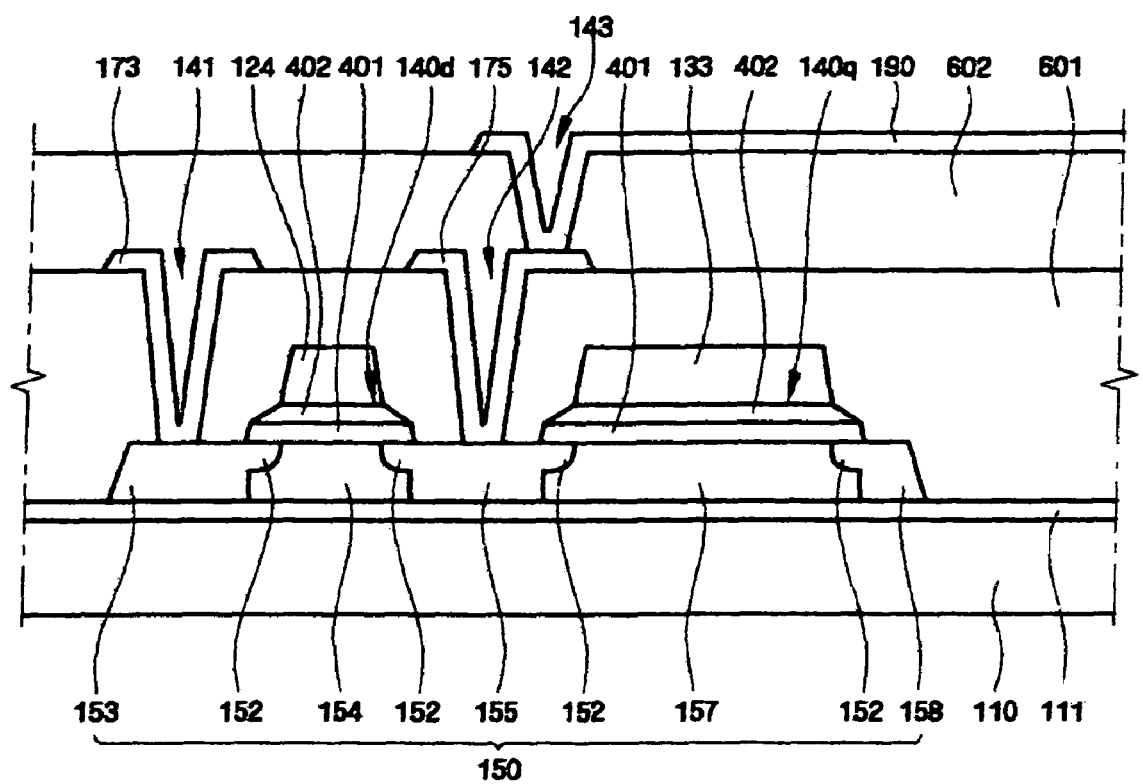

Next, a TFT plate according to yet another aspect of the present invention will be described with reference to FIG. 6. FIG. 6 is a sectional view of a TFT plate including a TFT according to embodiments of the present invention. The TFT plate according to this embodiment of the present invention is substantially the same as the TFT plate described above with respect to FIGS. 1-3 except that upper portions of both sidewalls of the second gate insulating layer pattern 402 are substantially aligned with both sidewalls of the gate electrode 124 and lower portions of both sidewalls of the second gate insulating layer pattern 402 are substantially aligned with the boundary portion between the lightly doped region 152 and the source region 153, the boundary portion between the lightly doped region 152 and the drain region 155, and the boundary portion between the lightly doped region 152 and the heavily doped region 158, and both sidewalls of the first gate insulating layer pattern 401 are substantially aligned with the lower portions of both sidewalls of the second gate insulating layer pattern 402. Repetitive explanation of the same elements will not be given.

Figure 7:
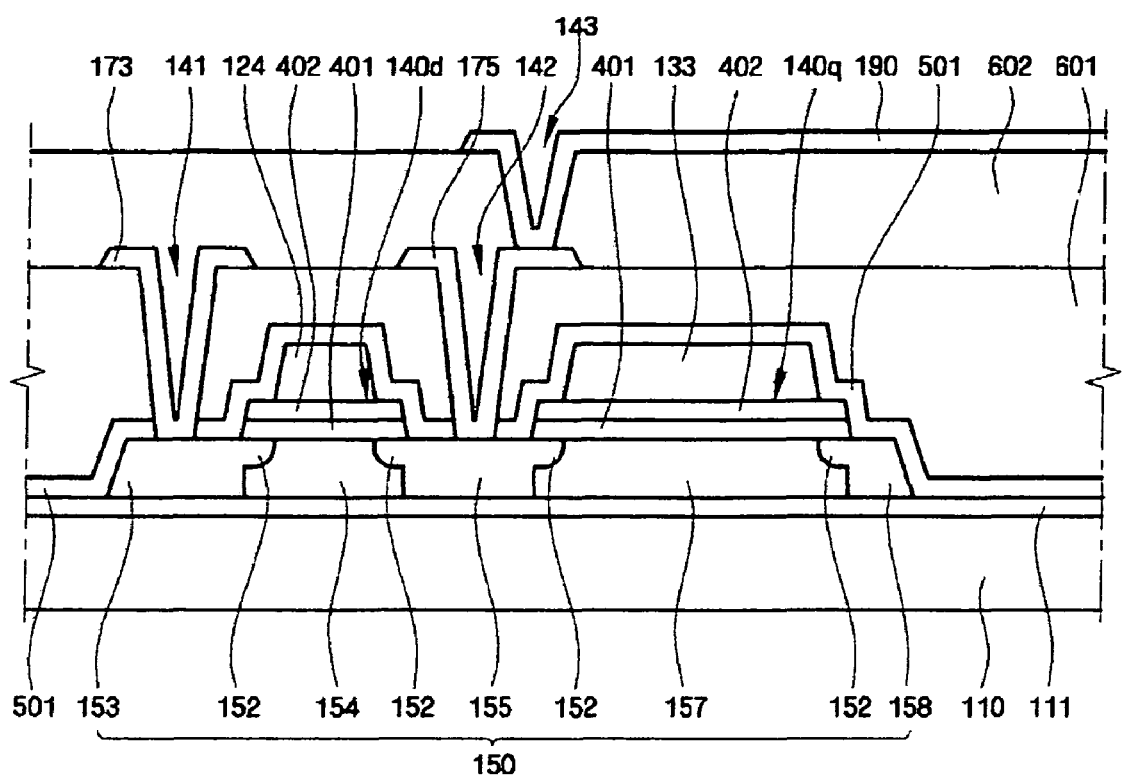

Next, a TFT plate according to yet another aspect of the present invention will be described with reference to FIG. 7. FIG. 7 is a sectional view of a TFT plate including a TFT according to embodiments of the present invention. The TFT plate according to this embodiment of the present invention is substantially the same as the TFT plate described above with respect to FIGS. 1-3 and 5 except that both sidewalls of the second gate insulating layer pattern 402 are substantially aligned with the boundary portion between the lightly doped region 152 and the source region 153, the boundary portion between the lightly doped region 152 and the drain region 155, and the boundary portion between the lightly doped region 152 and the heavily doped region 158, both sidewalls of the first gate insulating layer pattern 401 are substantially aligned with both sidewalls of the second gate insulating layer pattern 402, and a capping layer 501 is further formed on the resultant structure. Repetitive explanation of the same elements will not be given. The capping layer 501 includes a contact hole formed in a position that is substantially the same as a position where the first contact hole 141 and the second contact hole 142 of the first interlayer insulating layer 601 are formed. Function(s) of the capping layer will later be described in detail when describing a method of fabricating a TFT plate.

A method of fabricating a TFT plate according to an embodiment of the present invention will now be described in detail.

Figure 8:
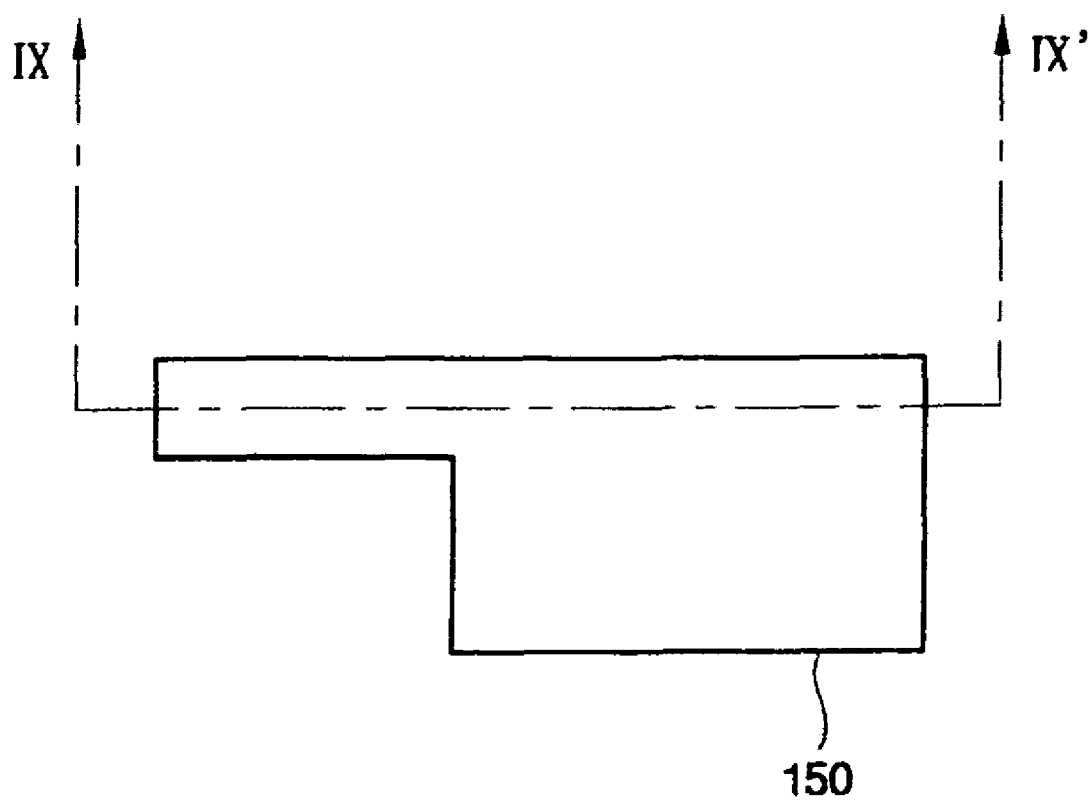
FIGS. 8, 11, 17, 19, and 21 are layouts illustrating steps of fabricating the pixel unit of the TFT plate shown in FIGS. 2 and 3.
Figure 9:
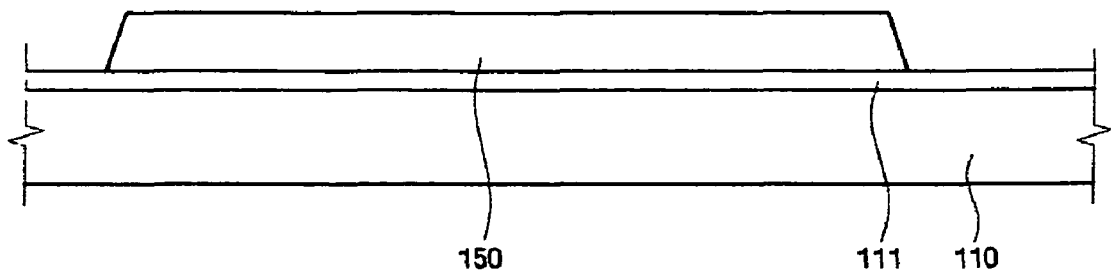
FIGS. 9 and 10 are sectional views of a TFT plate of FIG. 8 taken along a line IX-IX'.
Figure 10:
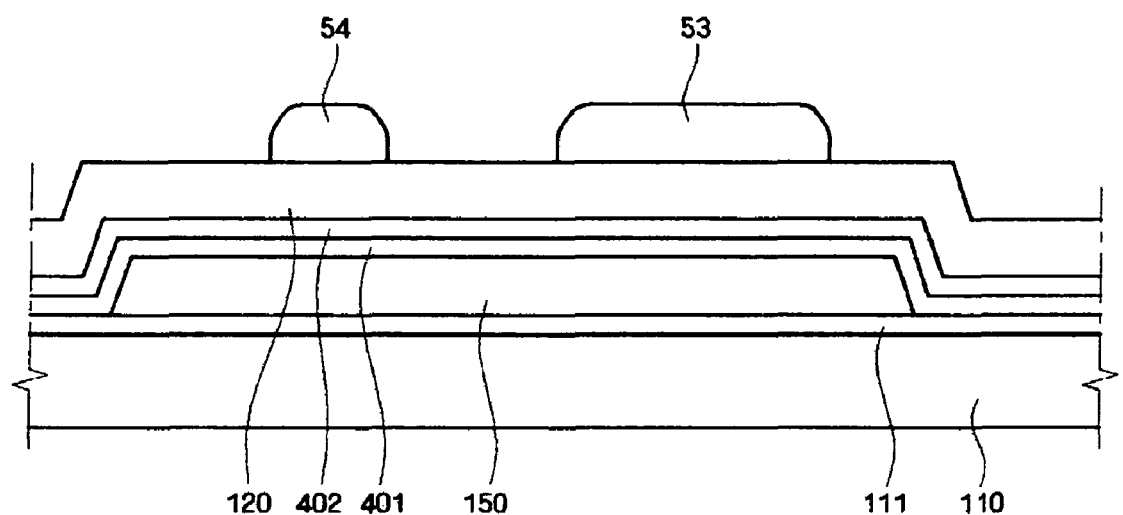
Figure 11:
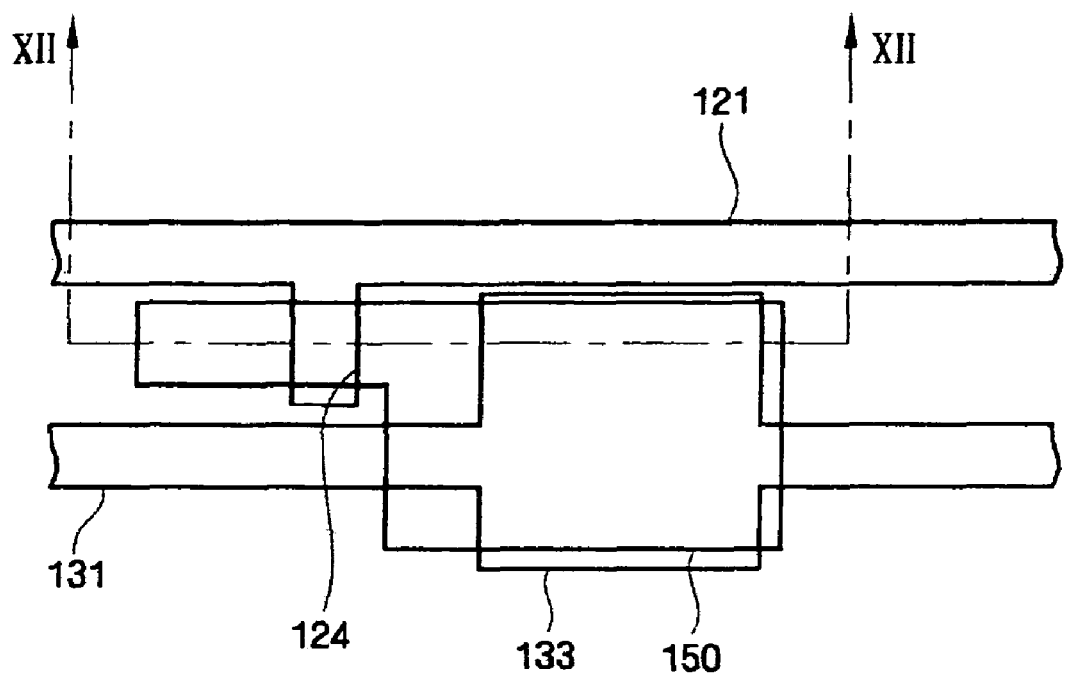
Figure 11:
Figure 15:
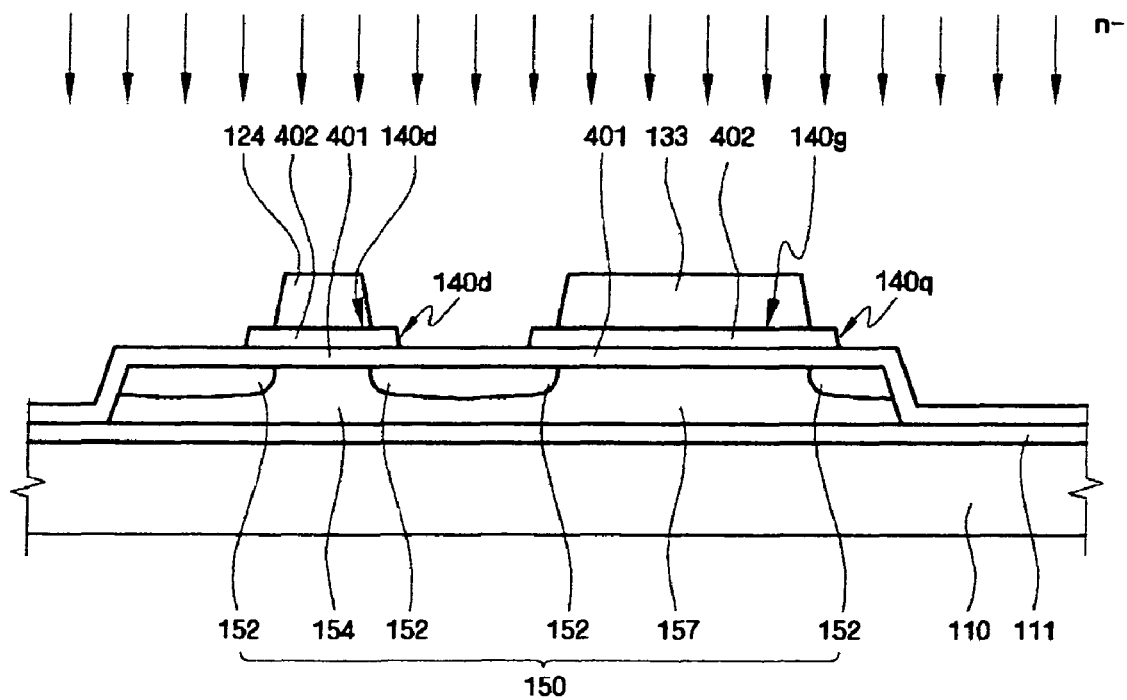
Figure 16:
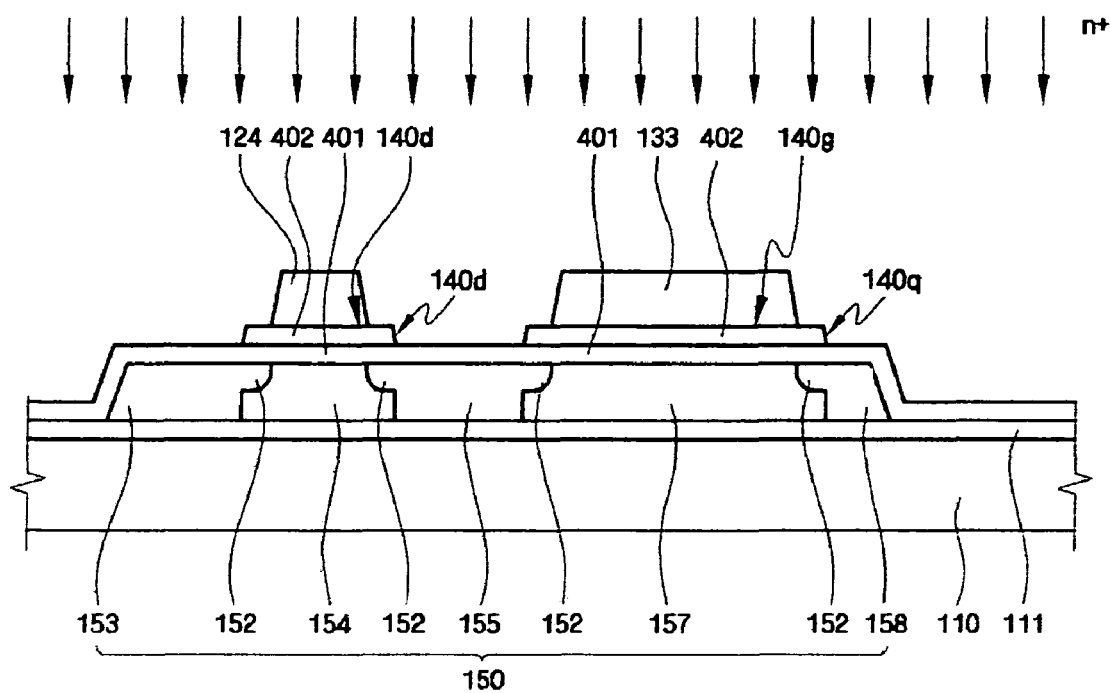
Figure 17:
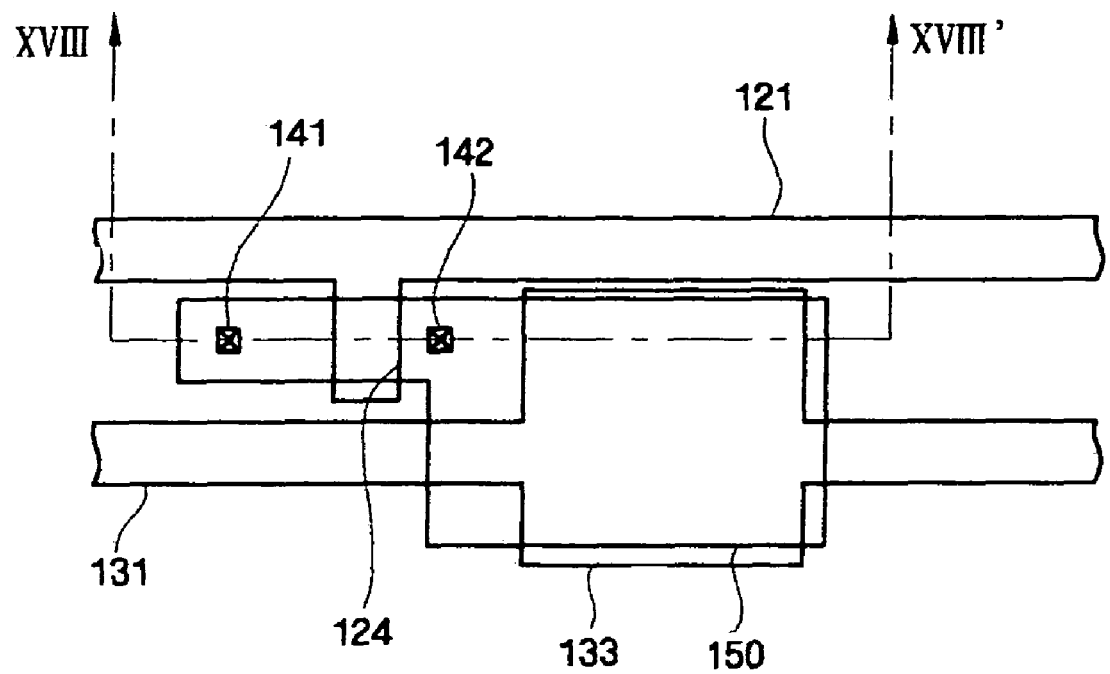
Figure 17:
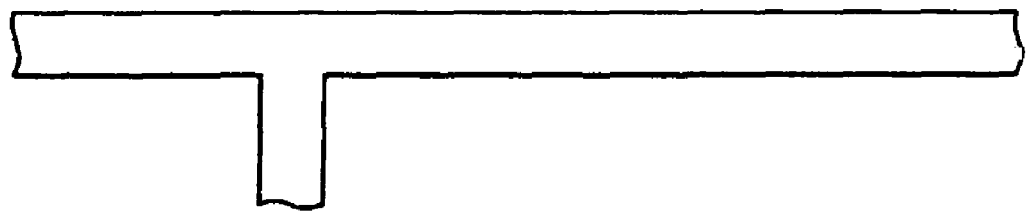
Figure 18:
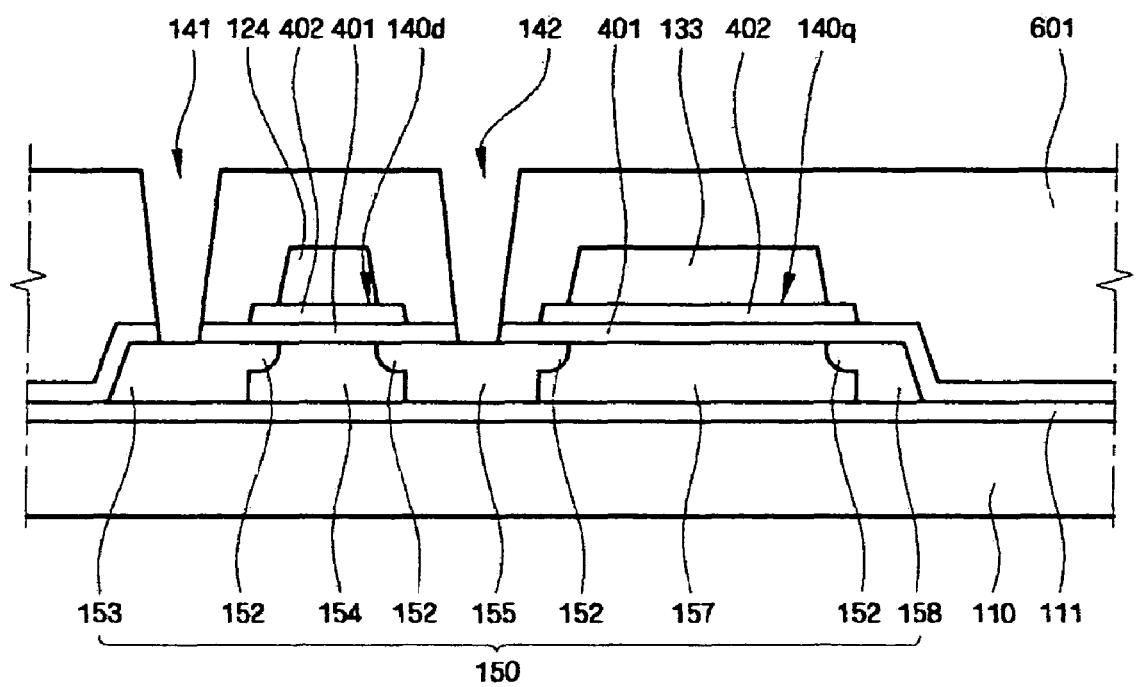
FIG. 18 is a sectional view of a TFT plate of FIG. 17 taken along a line XVIII-XVIII'.
Figure 19:
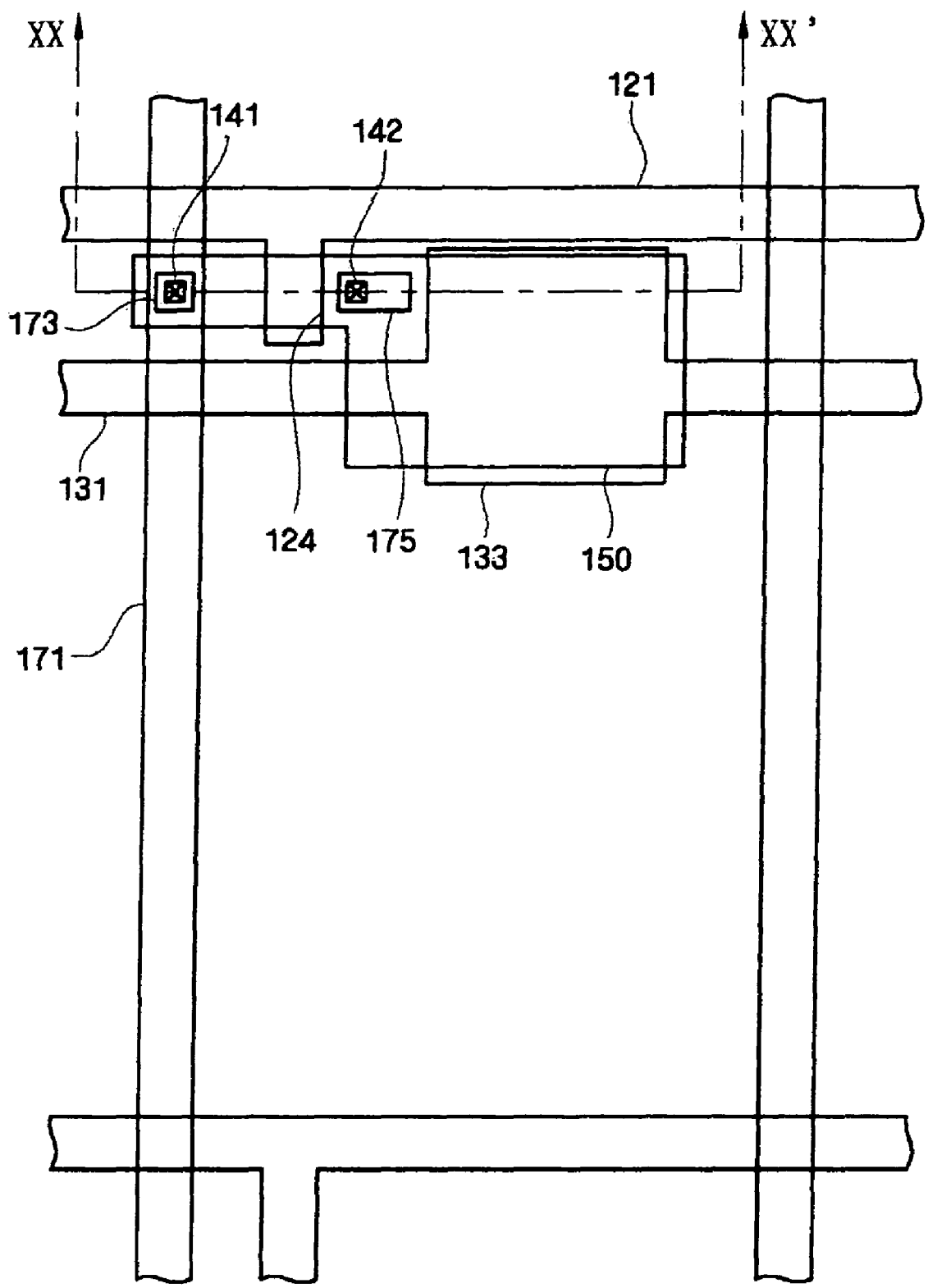
Figure 20:
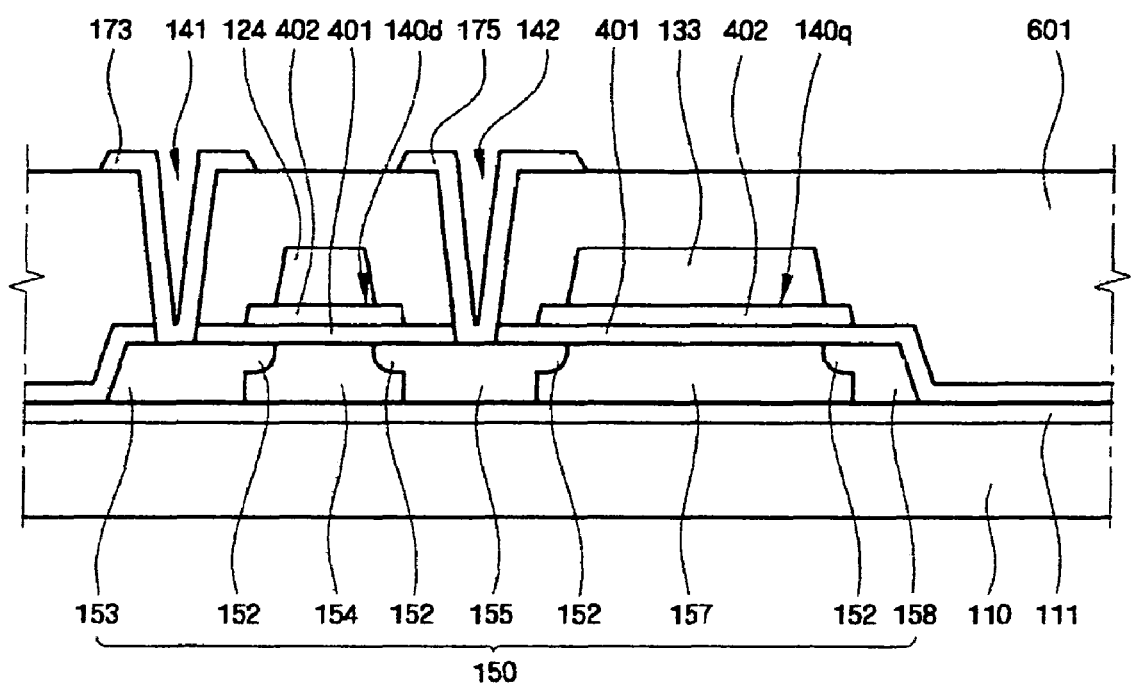
FIG. 20 is a sectional view of a TFT plate of FIG. 19 taken along a line XX-XX'.
Figure 21:
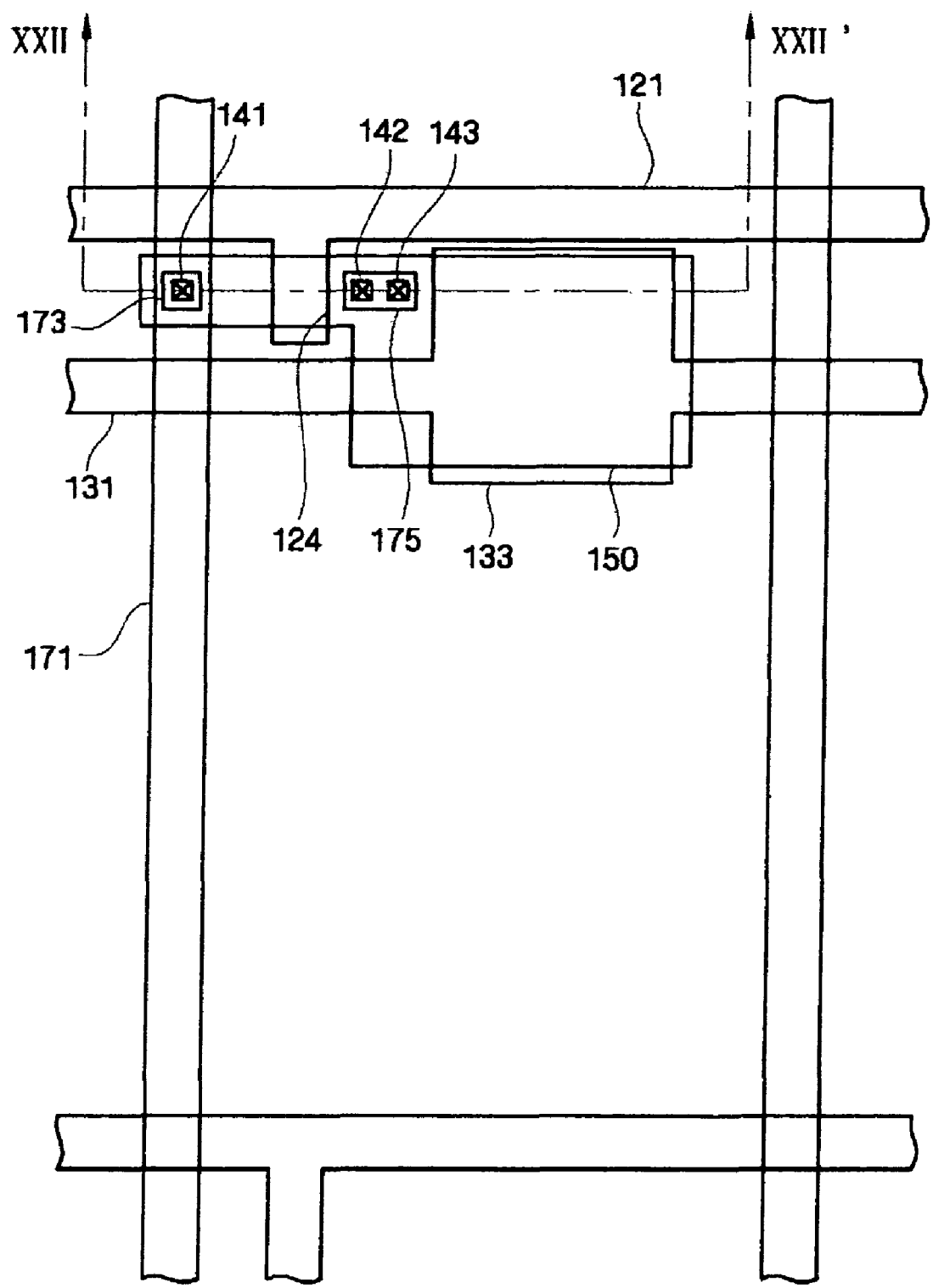
Figure 22:
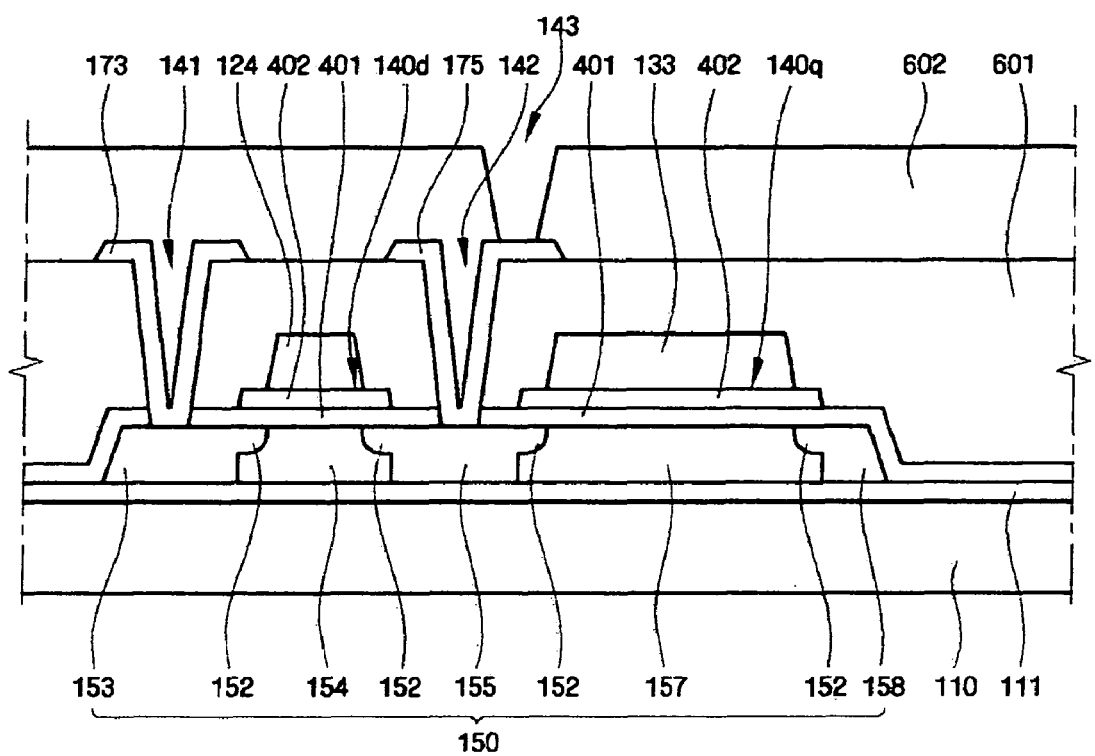
FIG. 22 is a sectional view of a TFT plate of FIG. 21 taken along a line XXII-XXII'.

FIGS. 8, 11, 17, 19, and 21 are layouts illustrating steps of fabricating the pixel unit of the TFT plate shown in FIGS. 2 and 3, FIGS. 9 and 10 are sectional views of a TFT plate of FIG. 8 taken along a line IX-IX', FIGS. 12 through 16 are sectional views of a TFT plate of FIG. 11 taken along a line XII-XII', FIG. 18 is a sectional view of a TFT plate of FIG. 17 taken along a line XVIII-XVIII', FIG. 20 is a sectional view of a TFT plate of FIG. 19 taken along a line XX-XX', and FIG. 22 is a sectional view of a TFT plate of FIG. 21 taken along a line XXII-XXII'.

First, as shown in FIGS. 8 and 9, the blocking layer 111 is formed on the transparent insulating substrate 110. Usable examples of the transparent insulating substrate 110 include glass, quartz, and sapphire. The blocking layer 111 is formed by depositing silicon oxide ($SiO_2$) or silicon nitride ($SiN_x$) in one example. The blocking layer 111 prevents impurities from being diffused into the semiconductor layer 150 from the transparent insulating substrate 110 but is not required and may not be formed in some embodiments. Amorphous silicon is deposited on the blocking layer 111 to form an amorphous silicon layer.

After amorphous silicon of the amorphous silicon layer is crystallized, for example, by laser annealing, furnace annealing, or solid phase crystallization, the amorphous silicon layer is patterned by photolithography, thereby forming the semiconductor layer 150 made of polycrystalline silicon.

Next, as shown in FIG. 10, an insulating material made of silicon oxide and an insulating material made of silicon nitride are sequentially deposited over the substrate 110 where the semiconductor layer 150 made of polycrystalline silicon is formed, thereby forming the first insulating layer 401 and the second insulating layer 402. A single layer or multi-layers made of aluminum, chromium, molybdenum, or an alloy thereof are deposited on the second insulating layer 402, thereby forming a gate metal layer 120. The thicknesses of the first insulating layer 401, the second insulating layer 402, and the gate metal layer 120 are not particularly limited and may vary with device characteristics. Next, a photoresist layer is formed on the gate metal layer 120 and is selectively exposed and developed by photolithography using a photomask, thereby forming photoresist layer patterns 53 and 54. The photoresist layer patterns 53 and 54 are used as etching masks for patterning the gate metal layer 120 as a gate electrode and as etching masks for patterning the second insulating layer 402 or the first insulating layer 401 as a gate insulating layer pattern to be described later. The photoresist layer patterns 53 and 54 may have various sectional shapes, for example, a trapezoidal section or a hemispherical section, in accordance with desired purposes. After a photoresist layer is patterned into a predetermined shape, the patterned photoresist layer is heated and shrunk to have a trapezoidal section. Alternatively, a flowable photoresist layer may be heated and formed so that its section becomes hemispherical.

The metal layer 120 for forming the gate electrode 124 may have two layers that have different physical characteristics from each other. One layer is preferably made of a low resistivity metal, such as Al or an Al alloy, for example, a metal containing Al such as an AlNd alloy, and so on. However, any similar materials may be used. A low resistivity metal is used to reduce signal delay or voltage drop. On the other hand, the other layer is preferably made of Mo, or a Mo alloy, for example, a Mo—W alloy, or Cr, and so on, which has good contact characteristics with indium zinc oxide (IZO) or indium tin oxide (ITO). However, any similar material may be used. For example, an Al—Nd metal layer may be wet etched using an etching solution containing about 8-15% of $CH_3COOH$, about 5-8% of $HNO_3$, about 50-60% of $H_3PO_4$, and the remainder being $H_2O$, the etching solution capable of etching Al with lateral inclination. Such an etching solution is capable of etching a MoW conductive layer with lateral inclination under the same etching condition. Thus, both the Al—Nd layer and the MoW layer can be continuously etched with lateral inclination.

Figure 12:
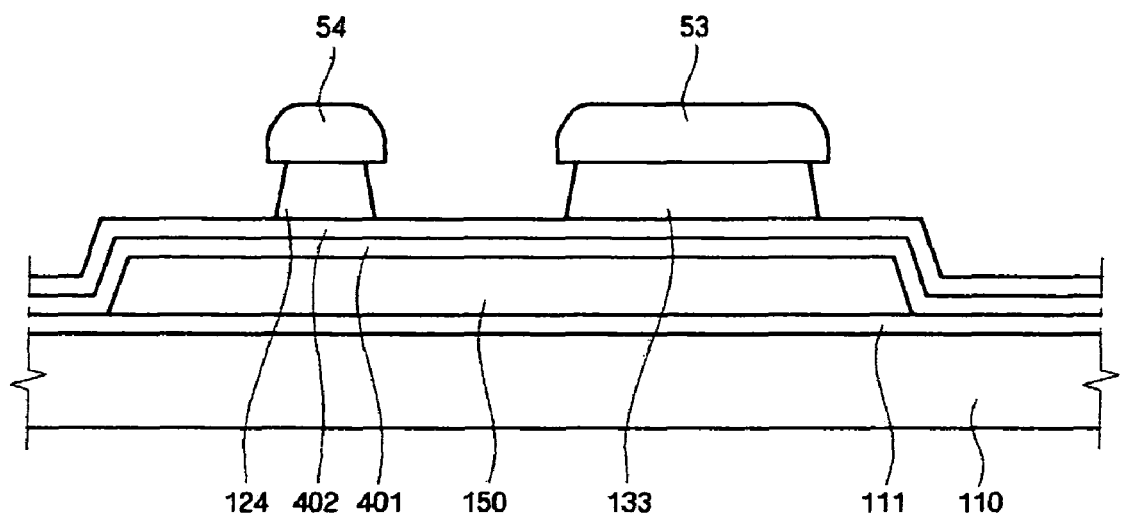
FIGS. 12 through 16 are sectional views of a TFT plate of FIG. 11 taken along a line XII-XII'.

Next, as shown in FIGS. 11 and 12, the gate metal layer 120 is patterned into an undercut structure by isotropic etching using the photoresist layer patterns 53 and 54 as masks, thereby forming the gate line 121 having the gate electrode 124 and the storage electrode line 131 having the storage electrode 133. It is preferable that sidewalls of cross-sections of the gate line 121 and the storage electrode line 131 be inclined to improve adherence to upper layers to be formed.

Figure 13:
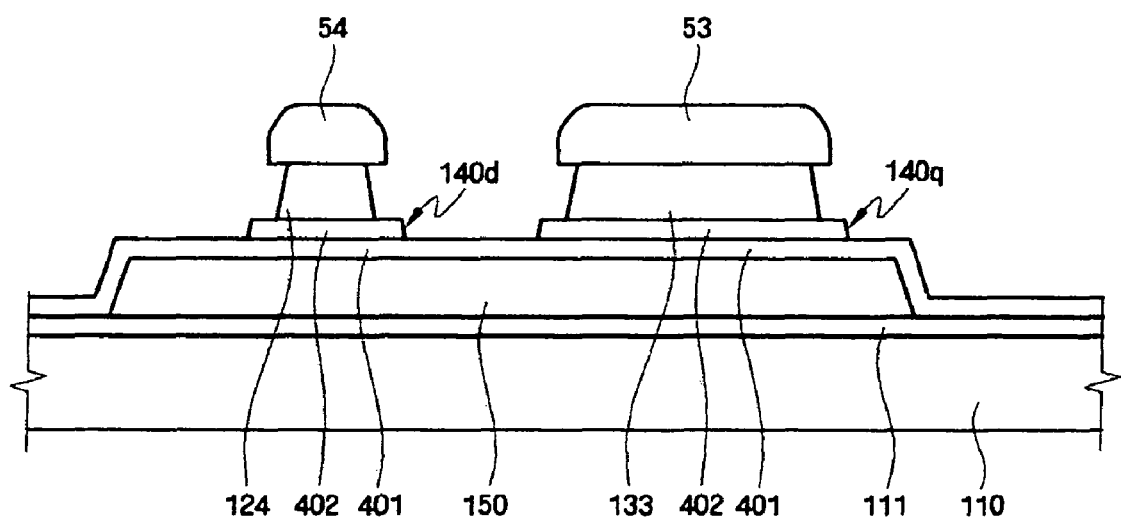

As shown in FIG. 13, the second insulating layer 402 is patterned by isotropic etching using the photoresist layer patterns 53 and 54 as etching masks, thereby forming the second gate insulating layer pattern 402 in such a way as to be wider than the gate line 124 and the storage electrode 133. Here, the second insulating layer pattern 402 is positioned between the semiconductor layer 150 made of polycrystalline silicon and the gate line 124 and also between the semiconductor layer 150 and the storage electrode 133, serving to insulate the semiconductor layer 150, the gate line 124, and the storage electrode 133 from one another. At the same time, the second insulating layer pattern 402 serves as an ion implantation mask in the case of implanting impurity ions for forming source and drain regions to be described later.

Next, the lightly doped region, the source region, and the drain region may be formed in the semiconductor layer 150 by performing impurity ion implantation once or by sequentially performing low-concentration impurity ion implantation and high-concentration impurity ion implantation.

Figure 14:
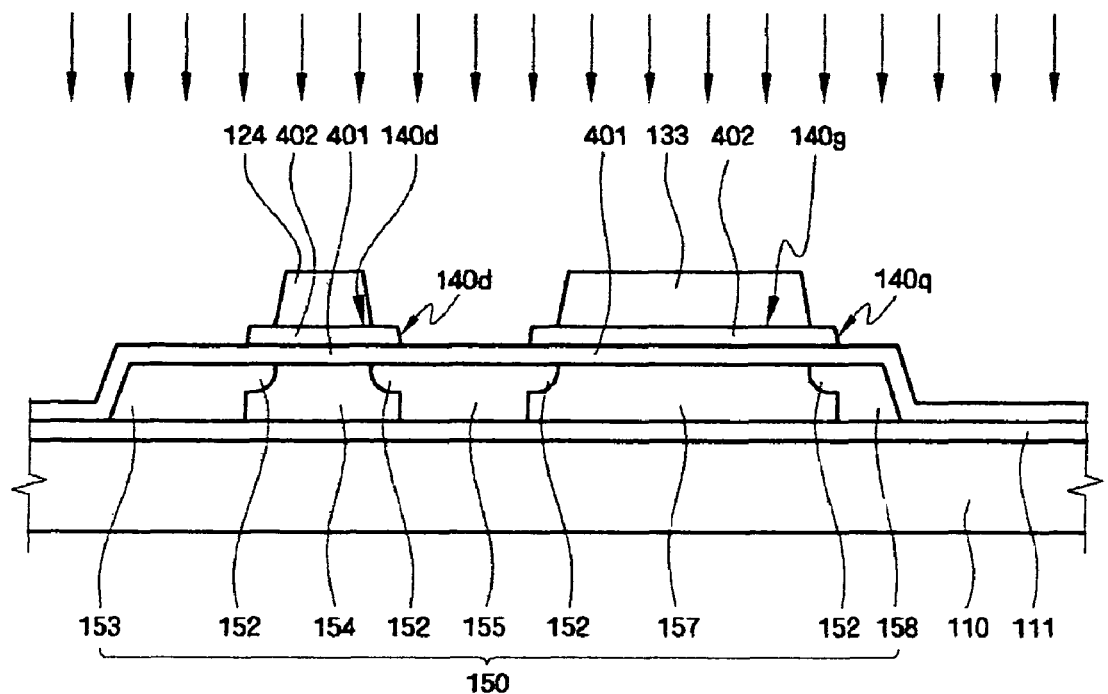

First, a case where the lightly doped region, the source region, and the drain region is formed by performing impurity ion implantation once will be described. As shown in FIG. 14, after the removal of the photoresist patterns 53 and 54, n-type impurity ion implantation is performed by plasma immersion using the gate electrode 124, the storage electrode 133, and the gate insulating layer patterns 140d and 140q as masks. A dose may be, for example, $1.0 \times 10^{15}$ to $3.0 \times 10^{15}$ particles per $cm^2$, and may vary according to the thickness of the gate insulating layer pattern, device characteristics, and the like. Accordingly, the TFT structure having the lightly doped region 152, the source region 153, and the drain region 155 is formed by performing impurity ion implantation once. In other words, the lightly doped region 152 is formed in the semiconductor layer 150 where ion implantation is prevented by the second gate insulating layer pattern 402 exposed by the gate electrode 124 and the storage electrode 133. The source region 153, the drain region 155, and the heavily doped region 158 are formed in the exposed portion of the semiconductor layer 150 since most of the ions penetrating a silicon oxide layer are projected and implanted to an exposed portion of the semiconductor layer 150 through the second gate insulating layer pattern 402. Since impurity ions are not implanted to a portion of the semiconductor layer 150 under the gate electrode 124 and the storage electrode 133, the channel region 154 and the storage electrode region 157 are formed in the portion to separate the source region 153, the drain region 155, and the heavily doped region 158. The formation of the TFT structure including the lightly doped region 152, the source region 153, and the drain region 155 is formed by one-time impurity ion implantation in this embodiment.

Next, a case where the lightly doped region, the source region, and the drain region are formed by sequentially performing low-concentration impurity ion implantation and high-concentration impurity ion implantation will be described. As shown in FIG. 15, after the removal of the photoresist layer patterns 53 and 54, n-type impurity ions are implanted at low concentration (n−) to the semiconductor layer 150 using scanning equipment or ion-beam equipment using the gate electrode 124, the storage electrode 133, and the gate insulating layer patterns 140d and 140q as masks, thereby forming the lightly doped region 152, the channel region 154, and the storage electrode region 157. In other words, ions are not implanted into the semiconductor layer 150 covered by the gate electrode 124 and the storage electrode 133 so that the channel region 154 and the storage electrode region 157 are formed, respectively. A predetermined amount of ions penetrating the gate insulating layer pattern are projected and implanted to the semiconductor layer 150 covered by the second gate insulating layer pattern 402 exposed by the gate electrode 124 and the storage electrode 133 so that the lightly doped region 152 is formed. Here, a dose may be, for example, $5.0 \times 10^{12}$ to $1.0 \times 10^{13}$ particles per $cm^2$, and may vary according to the thickness of the gate insulating layer pattern, device characteristics, or the like.

As shown in FIG. 16, n-type impurity ions are implanted at high concentration (n+) to the semiconductor layer 150 using scanning equipment or ion-beam equipment using the gate electrode 124, the storage electrode 133, and the gate insulating layer patterns 140d and 140q as masks, thereby forming the source region 153, the drain region 155, and the heavily doped region 158. In other words, since most of the ions penetrate a silicon oxide layer from the semiconductor layer 150 that is not covered by the second gate insulating layer pattern 402 and are projected and implanted to an exposed portion of the semiconductor layer 150 through the second gate insulating layer pattern 402, the source region 153, the drain region 155, and the heavily doped region 158 are formed in the exposed portion of the semiconductor layer 150. Here, a dose may be, for example, $1.0 \times 10^{15}$ to $3.0 \times 10^{15}$ particles per $cm^2$, and may vary according to the thickness of the gate insulating layer pattern, device characteristics, or the like.

Next, as shown in FIGS. 17 and 18, an insulating material is deposited on the entire surface of the substrate 110 in such a way as to cover the semiconductor layer 150 made of polycrystalline silicon, thereby forming the first interlayer insulating layer 601. The first interlayer insulating layer 601 is then patterned by photolithography using a mask, thereby forming the first contact hole 141 and the second contact hole 142 exposing the source region 153 and the drain region 155.

As shown in FIGS. 19 and 20, a data metal layer is formed on the first interlayer insulating layer 601 and is patterned by photolithography using a mask, thereby forming the data line 171, the drain electrode 175, and the source electrode 173. The source electrode 173 is connected to the source region 153 through the first contact hole 141 and the drain electrode 175 is connected to the drain region 155 through the second contact hole 142.

The data line 171 may be formed by depositing a single layer of conductive material such as Al, a metal containing Al such as an Al alloy, Mo, or a Mo alloy, or multiple layers such as an Al alloy layer, and a Cr or Mo alloy layer. Here, the data metal layer can be patterned using the same conductive material and etching method as the gate metal layer. The sectional surfaces of the data line 171 and the drain electrode 175 are preferably tapered at a predetermined angle of inclination for ensuring adhesion with overlying layers.

Next, as shown in FIGS. 21 and 22, an organic material having a superior flatness characteristic and photosensitivity is deposited on the first interlayer insulating layer 601 including the data line 171 and the drain electrode 175, thereby forming the second interlayer insulating layer 602. The second interlayer insulating layer 602 is then patterned by photolithography using a mask, thereby forming the third contact hole 143 exposing the drain electrode 175.

As shown in FIGS. 2 and 3, indium tin oxide (ITO) or indium zinc oxide (IZO) that is transparent is deposited on the second interlayer insulating layer 602 including the third contact hole 143 and is then patterned, thereby forming a connection member (not shown) for electrically connecting the pixel electrode 190 and a plurality of signal lines. The pixel electrode 190 is connected to the drain electrode 175 through the third contact hole 143. A contact auxiliary member is connected to the connection member that is electrically connected to the data line 171 and the gate line 121 through a fourth contact hole (not shown) extending over the first interlayer insulating layer 601 and the second interlayer insulating layer 602 and a fifth contact hole (not shown) extending over the first interlayer insulating layer 601, the second interlayer insulating layer 602, and the gate insulating layer 140.

In the method of fabricating the TFT plate according to an embodiment of the present invention, a gate insulating layer pattern is formed by patterning an insulating layer using a photoresist pattern for patterning a gate electrode. That is to say, a lightly doped region, a source region, and a drain region are formed by performing ion implantation using the gate insulating layer pattern as an ion implantation mask for defining the lightly doped region, the source region, and the drain region without additional processing steps, thereby simplifying the fabrication process and consequently minimizing the manufacturing cost.

Figure 23:
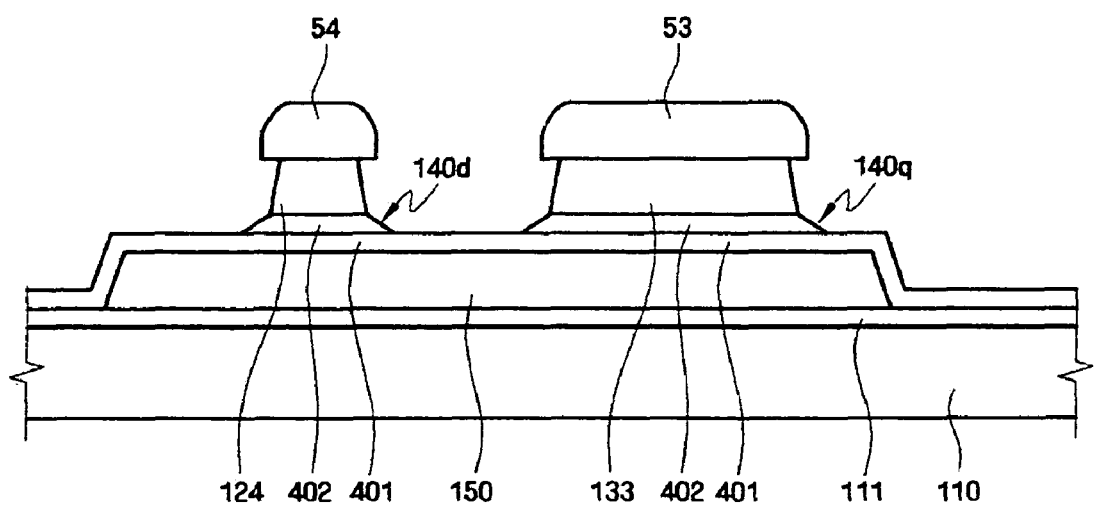
FIGS. 23 through 27 are sectional views illustrating steps of fabricating a TFT plate according to embodiments of the present invention.

Next, a method of fabricating a TFT plate according to another embodiment of the present invention will be described. FIG. 23 is a sectional view at an intermediate step of a method of fabricating a TFT plate according to another embodiment of the present invention.

As shown in FIG. 23, the method of fabricating a TFT plate according to this embodiment of the present invention is substantially the same as the method of fabricating the TFT plate according to the embodiment of the present invention shown in FIG. 4 except that a second gate insulating layer is patterned using the photoresist layer patterns 54 and 53 that had been used as etching masks for the gate electrode 124 and the storage electrode 133 such that the thicknesses of both sidewalls of the second gate insulating layer pattern 402 decrease when moving away from the respective gate electrode 124 or the storage electrode 133 (i.e., portions of second gate insulating layer pattern 402 are exposed by the gate electrode 204 and the storage electrode 133 to form tapered sections). In one example, a portion of the second insulation layer exposed by the gate electrode 124 is etched using a mixed gas of $SF_6$ and $O_2$ as an etching gas by an anisotropic etching process using the photoresist layer patterns 54 and 53 as etching masks for forming the gate electrode 124 and the storage electrode 133 such that an inclined surface is formed from a gate electrode region toward the outside.

The second gate insulating layer pattern 402 serves as ion implantation masks for forming the lightly doped region 152, the source region 153, the drain region 155, and the heavily doped region 158. The concentration of impurity ions implanted to the semiconductor layer 150 with respect to an inclined portion including inclined surfaces of the second gate insulating layer pattern 402 gradually increases towards both sidewalls of the second gate insulating layer pattern 402 due to the thickness variance of the inclined portion. Such a change in the concentration of impurity ions is determined by the shape of the inclined portion. The concentration of impurity ions implanted to the lightly doped region 152 gradually changes with the inclination (thickness variance) of the inclined portion. In the method of fabricating the TFT plate according to this embodiment of the present invention, the lightly doped region 152 having a gradual concentration change is included, thereby preventing degradation in the performance of a TFT by suppressing current leakage.

Although it has been described in the above embodiments of the present invention that only one of dual insulating layers is etched and used as an ion implantation mask for defining a source region, a drain region, and a lightly doped region, both of the dual insulating layers may be patterned to form a gate insulating layer pattern.

Figure 24:
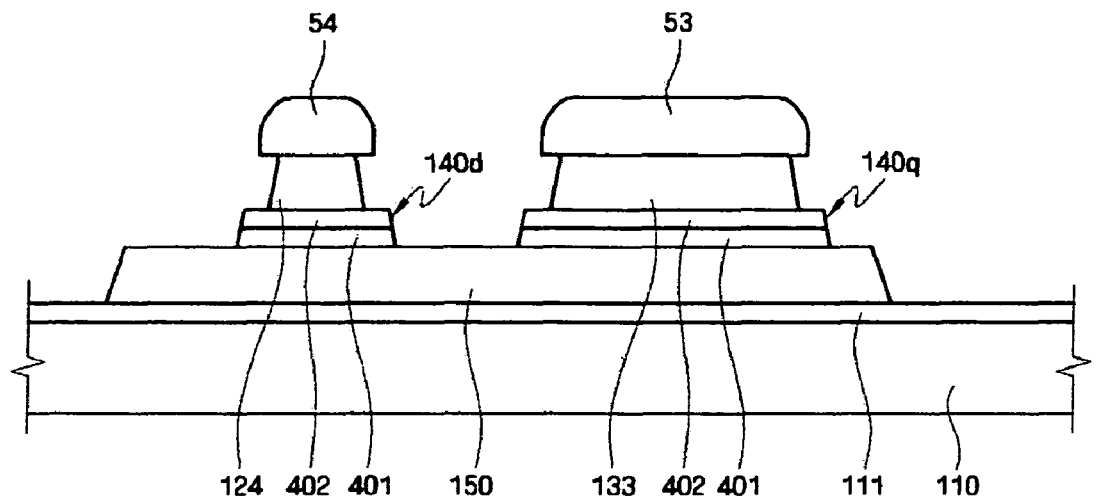

A method of fabricating a TFT plate according to still another embodiment of the present invention will be described. FIG. 24 is a sectional view illustrating a method of fabricating a TFT plate according to still another embodiment of the present invention. As shown in FIG. 24, the method of fabricating the TFT plate according to this embodiment of the present invention is substantially the same as the method of fabricating the TFT plate according to the embodiment of the present invention shown in FIG. 5 except that a second insulating layer is patterned using the photoresist layer patterns 54 and 53 that had been used as etching masks for the gate electrode 124 and the storage electrode 133 to form the second gate insulating layer pattern 402 to be wider than the gate electrode 124 and the storage electrode 133 and a first insulating layer is patterned using the photoresist layer patterns 54 and 53 as etching masks to form the first gate insulating layer pattern 401 of which both sidewalls are substantially aligned with both sidewalls of the second gate insulating layer pattern 402. In the TFT plate fabricated according to this embodiment of the present invention, the first gate insulating layer pattern 401 is formed only on the channel region 154 and the lightly doped region 152, making it simpler to control the concentration of impurity ions of the lightly doped region 152 to a desired concentration and thus, preventing degradation in the performance of a TFT by suppressing current leakage.

Figure 25:
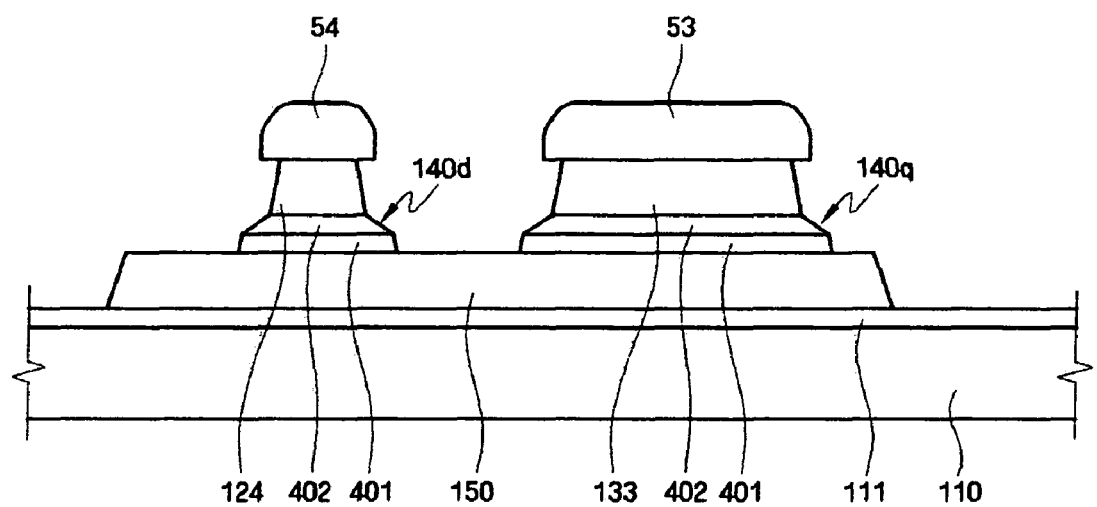

Next, a method of fabricating a TFT plate according to yet another embodiment of the present invention will be described. FIG. 25 is a sectional view illustrating a method of fabricating a TFT plate according to yet another embodiment of the present invention. As shown in FIG. 25, the method of fabricating the TFT plate according to this embodiment of the present invention is substantially the same as the method of fabricating the TFT plate according to the embodiment of the present invention shown in FIG. 6 except that a second insulating layer is patterned using the photoresist layer patterns 54 and 53 that had been used as etching masks for the gate electrode 124 and the storage electrode 133 such that the thicknesses of both sidewalls of the second gate insulating layer pattern 402 decrease toward its sidewalls from portions exposed by the gate electrode 124 and the storage electrode 133, and that a first insulating layer is patterned using the photoresist layer patterns 54 and 53 as etching masks to form the first gate insulating layer pattern 401 that is substantially aligned with lower portions of both sidewalls of the second gate insulating layer pattern 402. In the TFT plate fabricated according to this embodiment of the present invention, the lightly doped region 152 having a gradual concentration change and the first gate insulating layer pattern 401 are formed only on the channel region 154 and the lightly doped region 152, making it simpler to control the concentration of impurity ions of the lightly doped region 152 to a desired concentration and thus, preventing degradation in the performance of a TFT by suppressing current leakage.

Figure 26:
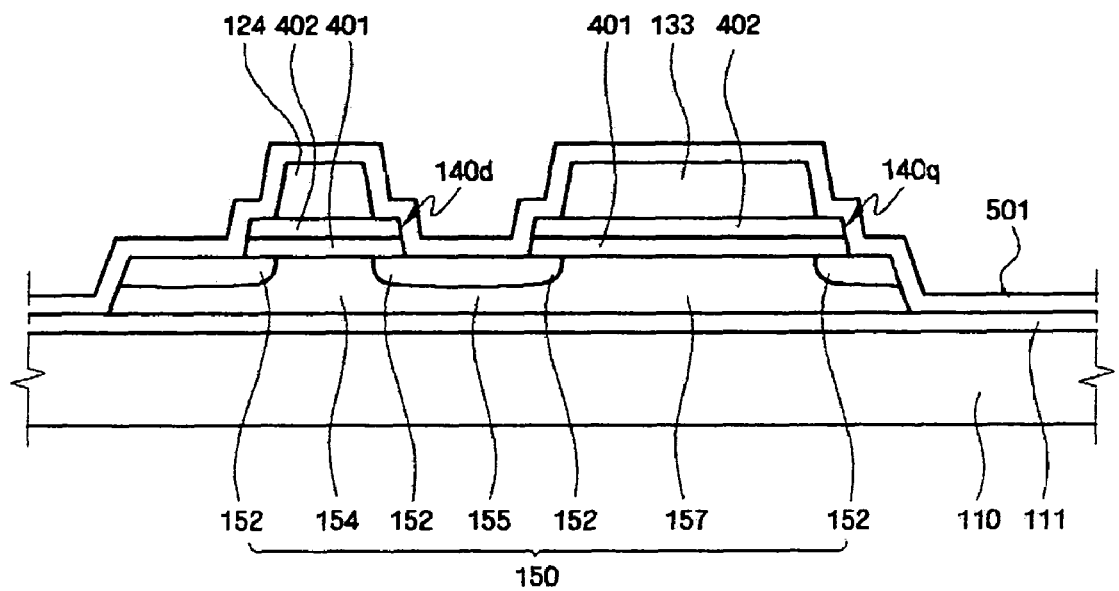
Figure 27:
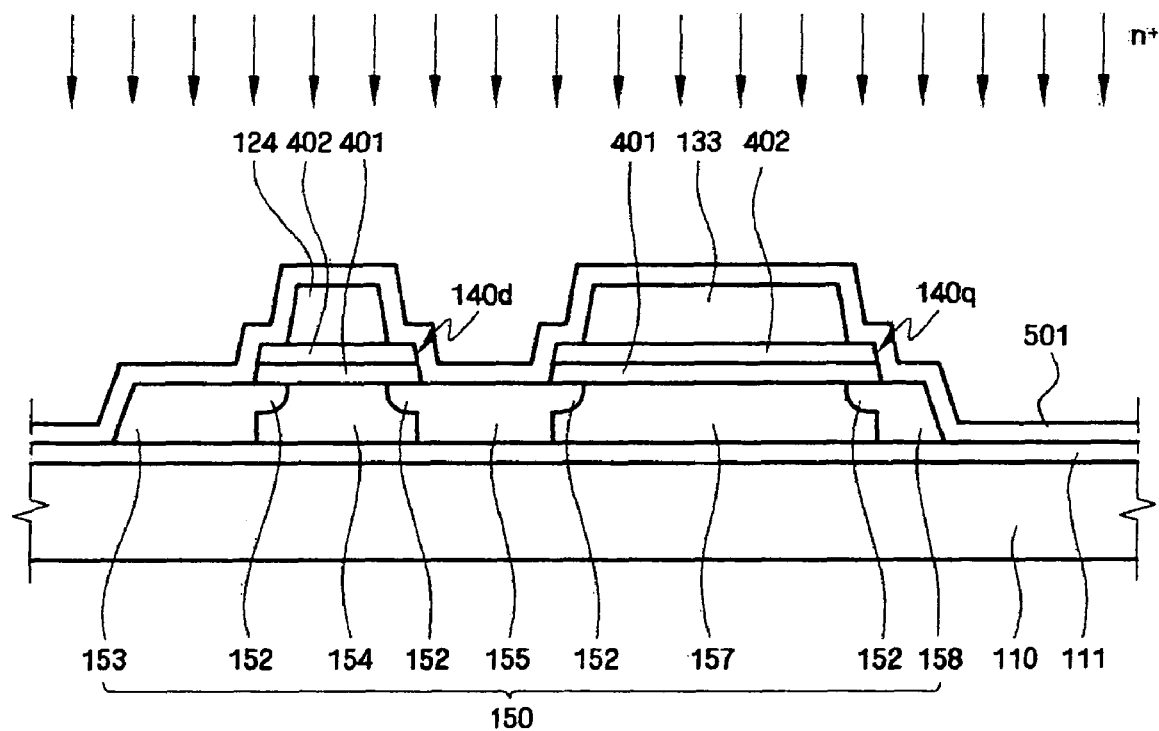

Methods of fabricating a TFT plate according to other embodiments of the present invention will be further described. FIGS. 26 through 27 are sectional views illustrating methods of fabricating TFT plates according to other embodiments of the present invention. First, the gate electrode 124 and the storage electrode 133 are formed in the same manner as the method of fabricating the TFT plate according to the embodiment of the present invention as described above with respect to FIG. 12. Next, as shown in FIG. 26, a first insulating layer and a second insulating layer are patterned using photoresist layers (54 and 53 of FIG. 12) used as etching masks for the gate electrode 124 and the storage electrode 133, thereby forming the first gate insulating layer pattern 401 and the second gate insulating layer pattern 402 to be wider than the gate electrode 124 and the storage electrode 133. Low-concentration impurity ions are then implanted using scanning equipment or ion-beam equipment using the gate electrode 124 and the storage electrode 133 as ion-implantation masks, thereby forming the lightly doped region 152. Here, a dose may be, for example, $5.0 \times 10^{12}$ to $1.0 \times 10^{13}$ particles per $cm^2$, and may vary according to the thickness of the gate insulating layer pattern, device characteristics, or the like. Next, a capping layer 501 is formed on the resulting structure. The capping layer 501 may be formed by CVD but is not limited thereto. Forming the capping layer 501 sufficiently prevents high concentration impurity ions from being implanted into the lightly doped region 152 during high-concentration ion implantation, which will later be described, while allowing impurity ions to be implanted into the source region 153, the drain region 155, and the heavily doped region 158 in desired concentrations. Therefore, it is possible to suppress an increase in the contact resistance between the source electrode and the drain electrode electrically connected with the source region 153 and the drain region 155, respectively. The capping layer 501 may be formed of silicon nitride or silicon oxide but is not limited thereto. A thickness of the capping layer 501 may vary according to device characteristics.

Next, as shown in FIG. 27, high concentration impurity ions are implanted with an energy of about 50-80 eV using scanning equipment or ion-beam equipment using the gate electrode 124, the storage electrode 133, and the gate insulating layer patterns 140d and 140q as masks, thereby forming the source region 153, the drain region 155, and the heavily doped region 158 in a portion of a semiconductor layer exposed through the first gate insulating layer pattern 401 and the second gate insulating layer pattern 402. The remaining steps of the method of fabricating a TFT plate according to yet another embodiment of the present invention are the same as those of the method of fabricating a TFT plate according to the embodiment of the present invention. Thus, the TFT plate according to yet another aspect of the present invention is fabricated as shown in FIG. 7. Here, a dose may be, for example, $1.0 \times 10^{15}$ to $3.0 \times 10^{15}$ particles per cm$^2$, and may vary according to the thickness of the gate insulating layer pattern, device characteristics, and the like.

As described above, according to the present invention, a gate electrode, a storage electrode, dual gate insulating layer patterns and/or a capping layer are used as the masks for impurity ion implantation forming the source/drain regions and the lightly doped region, thereby simplifying a fabricating process. Therefore, a TFT plate may be fabricated with improved processing efficiency but without degradation in performance by suppressing current leakage.

Although the present invention has been described in connection with the exemplary embodiments of the present invention, it will be apparent to those skilled in the art that various modifications and changes may be made thereto without departing from the scope and spirit of the invention. For example, although TFTs formed by n-type impurity doping have been described hereinabove, the invention can be applied to TFT formed by p-type impurity doping as well. Therefore, it should be understood that the above embodiments are not limitative, but illustrative in all aspects.

What is claimed is:
1. A thin film transistor (TFT) plate, comprising:
a substrate;
a semiconductor layer formed on the substrate and including a lightly doped region adjacent to both sides of a channel region, and a source region and a drain region adjacent to the lightly doped region;
a gate electrode formed on the channel region of the semiconductor layer;
a first gate insulating layer formed between the semiconductor layer and the gate electrode;
a second gate insulating layer formed between the first gate insulating layer and the gate electrode and having sidewalls with upper portions having boundaries that are substantially aligned with the gate electrode and lower portions having boundaries that are substantially aligned with a boundary portion between the lightly doped region and the source region and a boundary portion between the lightly doped region and the drain region;
an interlayer insulating layer formed on the gate electrode, the first gate insulating layer, and the second gate insulating layer; and
a source electrode and a drain electrode formed on the interlayer insulating layer, the source electrode electrically connected to the source region through a first contact hole and the drain electrode electrically connected to the drain region through a second contact hole,
wherein boundaries of lower portions of sidewalls of the gate electrode completely contact boundaries of the upper portions of the sidewalls of the second gate insulating layer.
2. The TFT plate of claim 1, wherein sidewalls of the first gate insulating layer are substantially aligned with lower portions of the sidewalls of the second gate insulating layer.
3. The TFT plate of claim 1, wherein the first gate insulating layer has sidewalls that are substantially aligned with a boundary portion between the lightly doped region and the source region and a boundary portion between the lightly doped region and the drain region.
4. The TFT plate of claim 1, wherein the first gate insulating layer is comprised of silicon oxide and the second gate insulating layer is comprised of silicon nitride.
5. The TFT plate of claim 1, wherein the concentration of impurity ions of the lightly doped region gradually increases towards the boundary portion between the lightly doped region and the channel region from the boundary portion between the lightly doped region and the source/drain region.
6. The TFT plate of claim 1, wherein the first gate insulating layer and the inter layer insulating layer includes the first and second contact holes.
7. The TFT plate of claim 1, further comprising a capping layer between the second gate insulating layer and the interlayer insulating layer.
8. The TFT plate of claim 7, wherein the capping layer is comprised of one of silicon nitride and silicon oxide.
9. The TFT plate of claim 7, wherein sidewalls of the first gate insulating layer are substantially aligned with the sidewalls of the second gate insulating layer.

* * * * *